(12) United States Patent
Sawada et al.

(10) Patent No.: US 6,998,858 B2
(45) Date of Patent: Feb. 14, 2006

(54) PROBE HEAD, ITS ASSEMBLY METHOD AND PROBE CARD

(75) Inventors: Shuichi Sawada, Hamamatsu (JP); Masaya Tsuchie, Shizuoka-ken (JP)

(73) Assignee: Yamaha Corporation, (JP)

( * ) Notice: Subject to any disclaimer, the term of this patent is extended or adjusted under 35 U.S.C. 154(b) by 0 days.

(21) Appl. No.: 10/779,882

(22) Filed: Feb. 18, 2004

(65) Prior Publication Data

US 2004/0239351 A1  Dec. 2, 2004

(30) Foreign Application Priority Data

Feb. 18, 2003  (JP)  ............................ 2003-039710
Apr. 18, 2003  (JP)  ............................ 2003-114391

(51) Int. Cl.
  *G01R 31/02*  (2006.01)
(52) U.S. Cl. ..................................... 324/754
(58) Field of Classification Search ............... 324/754, 324/756, 757, 758, 761, 762, 765, 158.1
See application file for complete search history.

(56) References Cited

U.S. PATENT DOCUMENTS

| | | | | |
|---|---|---|---|---|
| 4,719,417 A | * | 1/1988 | Evans | ......................... 324/762 |
| 5,416,429 A | * | 5/1995 | McQuade et al. | .......... 324/762 |
| 5,828,225 A | * | 10/1998 | Obikane et al. | ............. 324/758 |
| 6,271,674 B1 | * | 8/2001 | Hasegawa et al. | .......... 324/754 |
| 6,825,052 B1 | * | 11/2004 | Eldridge et al. | .............. 438/15 |
| 6,842,023 B1 | * | 1/2005 | Yoshida et al. | ............. 324/754 |

FOREIGN PATENT DOCUMENTS

| | | |
|---|---|---|
| JP | 07-321170 | 12/1995 |
| JP | 10-300784 | 11/1998 |
| JP | 2000-046869 | 2/2000 |
| JP | 2000-065860 | 3/2000 |
| JP | 2000-329788 | 11/2000 |

OTHER PUBLICATIONS

Korean Office Action issue Jul. 28, 2005 (w/ English translation of relevant portions).

* cited by examiner

*Primary Examiner*—Vinh Nguyen
*Assistant Examiner*—Tung X. Nguyen
(74) *Attorney, Agent, or Firm*—Dickstein, Shapiro, Morin & Oshinsky, LLP.

(57) ABSTRACT

A slide unit is slid on a flat slide plane of a table to adjust the relative positions of a plurality of slide units along a direction parallel to the flat slide plane. Even if the slide unit moves together with a movable unit along the direction parallel to the flat slide plane, the relative positions of a plurality of movable units will not change along a direction vertical to the flat slide plane. By sliding the slide unit on the flat slide plane of the table and moving the movable unit along the direction vertical to a slide surface, the relative positions of a plurality of probes mounted on the movable units can be adjusted independently and separately along the directions parallel to and vertical to the flat slide plane.

10 Claims, 23 Drawing Sheets

FIG.5A1
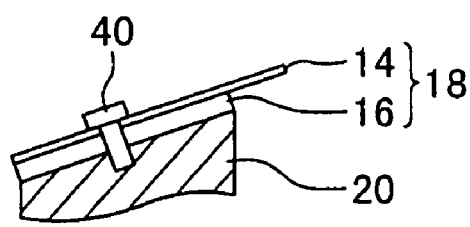
FIG.5A2
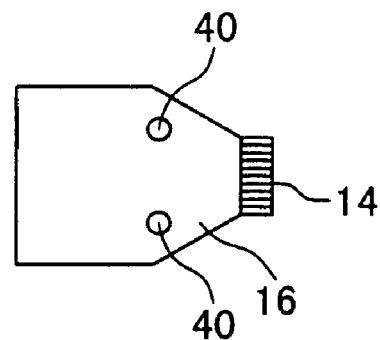
FIG.5B1
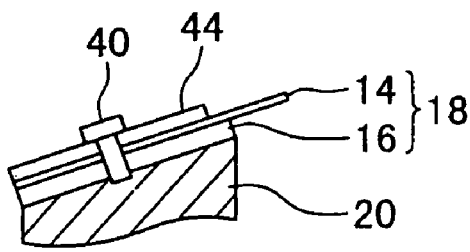
FIG.5B2
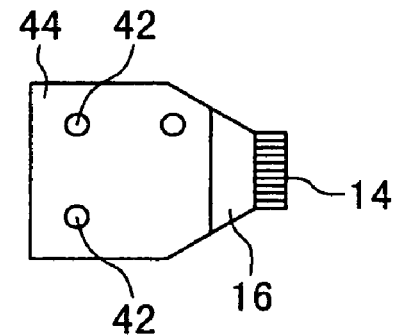
FIG.5C1
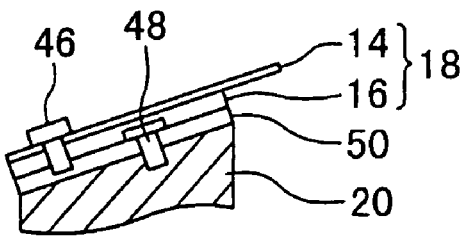
FIG.5C2
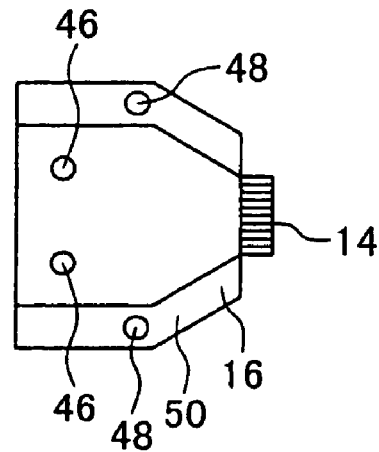

FIG.6A1
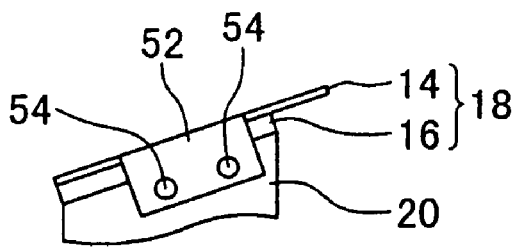
FIG.6A2
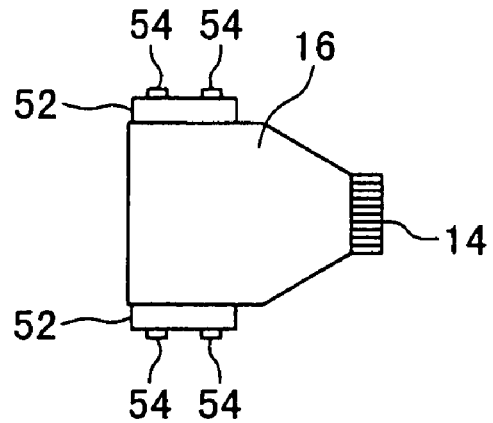
FIG.6B1
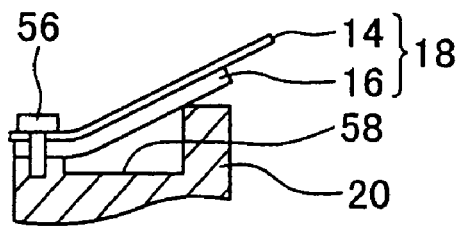
FIG.6B2
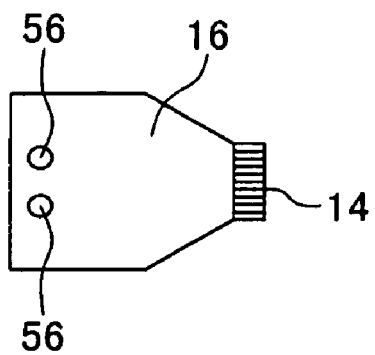
FIG.6C1
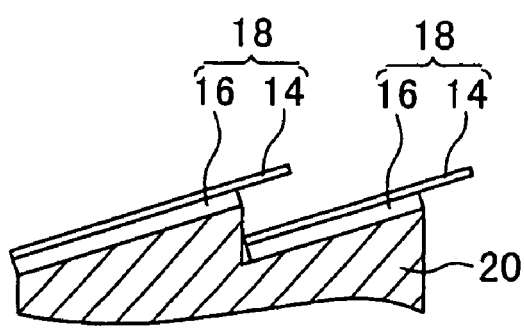
FIG.6C2
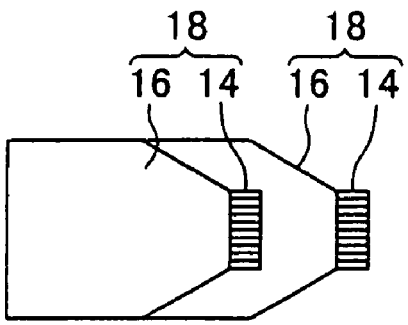

PROBE HEAD, ITS ASSEMBLY METHOD AND PROBE CARD

CROSS REFERENCE TO RELATED APPLICATION

This application is based on and claims priority of Japanese Patent Application No. 2003-039710 filed on Feb. 18, 2003 and Japanese Patent Application No. 2003-114391 filed on Apr. 18, 2003, the entire contents of which are incorporated herein by reference.

BACKGROUND OF THE INVENTION

A) Field of the Invention

The present invention relates to a probe head for inspecting the electric characteristics of an electronic device such as a semiconductor integrated circuit and a liquid crystal panel, and to its assembly method and a probe card. In this embodiment, it is assumed that the probe card has a printed circuit board to be mounted on an inspection apparatus (prober) and a probe head fixed to the printed circuit board, and that the probe head has a plurality of probes (probe pins).

B) Description of the Related Art

In a conventional method of inspecting the electric characteristics of an electronic device, a probe card disposed with a number of probes having protruded top ends is lowered to contact the top ends of the probes to the electrodes of the device. As the integration degree of electronic devices becomes large, the pitch of electrodes is made narrower and narrower. It becomes much more necessary to perform the position alignment between the probes and electrodes of an electronic device at a precision in the order of $\mu$m.

Patent Document #1, Japanese Patent Laid-open Publication No. HEI-10-300784, Patent Document #2, Japanese Patent Laid-open Publication No. 2000-46869, disclose the technologies of adjusting the relative positions of four substrates disposed with probes by sucking the substrates on a slanted plane.

Patent Document #3, Japanese Patent Laid-open Publication No. 2000-65860, discloses the technologies wherein four mounting bases each having a slanted plane and disposed with probes are disposed on substrates, and after the substrates are fixed, the position alignment in the x-, y- and z-directions of each mounting base is performed relative to a rectangular base clump.

According to the technologies disclosed in Patent Documents #1, #2 and #3, as the positions along the z-direction of a plurality of substrates disposed with probes are adjusted, the positions along the x- and y-directions of the substrate vary. For example, according to Patent Document #3 (refer to FIG. 4 in this Document), as the z-axis adjusting screw 62 is rotated to move the contact probes 1 together with the mounting base 36 along the z-direction, the mounting base 36 swings so that the top ends of the contact probes 1 displace along the x- and y-directions. According to the technologies disclosed in Patent Documents #1, #2 and #3, it is therefore difficult to adjust the positions along the x-, y- and z-directions of the substrates because the adjustment along the x- and y-directions and the adjustment along the z-axis direction mutually influence.

In the probe cards disclosed in Patent Documents #1, #2 and #3, the contact probes and a printed circuit board are electrically connected in the following manner. Partial areas of a wiring pattern of contact probes are exposed in a window formed in a substrate made of a resin film for supporting the contact probes, and the wiring pattern exposed in the window is made in pressure contact with the electrodes of the printed circuit board. With this arrangement, as the contact probes are moved relative to the printed circuit board, the resin film substrate supporting the contact probes is deflected. Since the resin film is hardly bent along the surface direction of the film, the easy direction of moving the contact probes relative to the printed circuit board is limited. Accordingly, for the probe head disclosed in Patent Documents #1, #2 and #3, it is difficult to adjust freely and omnidirectionally the position and posture of each contact probe.

SUMMARY OF THE INVENTION

The present invention has been made to solve such problems and an object of this invention is to provide a probe head capable of adjusting the positions of probes at a high precision, its assembly method and a probe card.

In order to achieve the above-described object, the present invention provides a probe head comprising: a table having a flat slide plane; a plurality of slide units each having a slide surface for sliding on the flat slide plane; a lift unit provided for each of the slide units, the lift unit being capable of moving along a vertical direction; probes provided for each of the lift units, a top end of each of the probes protruding from the lift unit; and positioning means for positioning the lift unit relative to the slide unit and the slide unit relative to the table. By sliding the slide unit on the flat slide plane, the relative positions of the plurality of slide units can be adjusted along the direction parallel to the flat slide plane. Even if the slide unit together with the lift unit moves along the direction parallel to the flat slide plane, the relative positions of the plurality of lift units will not change along the direction vertical to the flat slide plane. Namely, by sliding the slide units on the flat slide plane of the table and moving the lift units along the direction vertical to the flat slide plane, the relative positions of the plurality of probes provided for each lift unit can be adjusted separately and independently for each of the directions parallel to and vertical to the flat slide plane. According to the invention, therefore, since the relative positions of the probes can be adjusted separately and independently for each of the z- y- and z-directions which are mutually perpendicular, the relative positions of the probes can be adjusted at a high precision.

In the probe head of this invention, the lift unit comprises a movable unit movable along the vertical direction relative to the slide surface and a support unit fixed to the movable unit and disposed with the probes. By dividing the lift unit into the support unit disposed with the probes and the movable unit, for example, the probes and support unit can be formed integrally for each inspection object device by a series of thin film manufacture processes in accordance with the pitch of device electrodes, and the movable unit can be standardized common to a plurality of inspection object devices.

In the probe head of this invention, the lift unit comprises a movable unit integrally formed with the slide unit and having one end connected to the slide unit and another end made as a free end, and a support unit fixed to the movable unit and disposed with the probes, and the positioning means includes a screw threaded into the slide unit for moving the movable unit along a direction extending remote from the slide surface and along a direction extending near to the slide surface. The movable unit integrally formed with the slide unit is made movable in a direction vertical to the slide surface, so that the number of components can be reduced. Specifically, the movable unit having one end connected to the slide unit and the other end made as a free end is formed integrally with the slide unit and the position of the movable unit is determined by screws, so that the number of components can be reduced.

In the probe head of this invention, the lift unit comprises a movable unit supported pivotally by the slide unit and a support unit fixed to the movable unit and disposed with the probes, and the positioning means includes a screw threaded into the slide unit for moving the movable unit along a direction extending remote from the slide surface and along a direction extending near to the slide surface. Since the movable unit is supported pivotally by the slide unit, the adjustment range of the movable unit can be broadened.

In the probe head of this invention, the slide unit includes guide means for guiding the lift unit slidably along a direction inclined relative to the slide surface. Since the lift unit can slide relative to the slide unit along the direction inclined relative to the slide surface, the number of components can be reduced.

In the probe head of this invention, the lift unit comprises a movable unit for sliding along the direction inclined relative to the slide surface by being guided by the guiding means, a support unit disposed with the probes and an engagement unit for detachably engaging the support unit with the movable unit. The movable unit capable of sliding along the direction inclined relative to the slide surface and the support unit disposed with the probes are made as discrete components mutually detachable. Therefore, when the probes along with the support unit are replaced, the positions and postures of the probes relative to the table are not required to be adjusted again to obtain the adjustment state before replacement. The probe head of this invention further comprises an elastic member interposed between the lift unit and the slide unit, wherein the positioning means includes a screw threaded into the lift unit and the slide unit. Deformation of the elastic member interposed between the lift unit and the slide unit allows the movable unit to move along the direction vertical to the slide surface. The position of the lift unit can therefore be determined without any play.

In the probe head of this invention, the table is fixed to a printed circuit board to be electrically connected to the probes. Since the relative positions of the probes can be adjusted before the table is fixed to the printed circuit board, the printed circuit board can be standardized. Preparation for a printed circuit board and assembly of the probes can be performed concurrently and also the standardized printed circuit board can be used again with other components.

In order to achieve the above-described object, the invention provides an assembly method for the probe head described above, comprising the steps of: moving the lift unit along the vertical direction relative to the slide surface to determine a position of the lift unit relative to the slide unit; and sliding the slide unit on the flat slide plane to determine a position of the slide unit relative to the table. By sliding the slide units on the flat slide plane, the relative positions of a plurality of slide units can be adjusted along the direction parallel to the flat slide plane. Even if the slide unit together with the lift unit moves along the direction parallel to the flat slide plane, the relative positions of the plurality of lift units will not change along the direction vertical to the flat slide plane. Namely, by sliding the slide units on the flat slide plane of the table and moving the lift units along the direction vertical to the flat slide plane, the relative positions of the plurality of probes provided for each lift unit can be adjusted separately and independently for each of the directions parallel to and vertical to the flat slide plane. According to the invention, therefore, since the relative positions of the probes can be adjusted separately and independently for each of the z- y- and z-directions which are mutually perpendicular, the relative positions of the probes can be adjusted at a high precision.

In order to achieve the above-described object, the invention provides a probe card comprising: a printed circuit board; a support unit whose position is determined relative to the printed circuit board; probes held by the support unit; adjusting means for adjusting a position or posture of the support unit relative to the printed circuit board; and wires electrically connecting the probes to electrodes of the printed circuit board. Since the wires can be bent easily, the wires interconnecting the probes and electrodes of the printed circuit board facilitate to adjust omnidirectionally and freely the positions and postures of the probes relative to the printed circuit board. According to the invention, therefore, the positions and postures of the probes can be adjusted at a high precision.

In order to achieve the above-described object, the invention provides a probe card comprising: a printed circuit board; a support unit whose position is determined relative to the printed circuit board; probes held by the support unit; adjusting means for adjusting a position or posture of the support unit relative to the printed circuit board; and a flexible printed circuit board having flying leads whose top ends are connected to the probes or electrodes of the printed circuit board, the flexible printed circuit board electrically connecting the probes and the electrodes of the printed circuit board. Since the wires can be bent easily, the wires interconnecting the probes and electrodes of the printed circuit board facilitate to adjust omnidirectionally and According to the invention, therefore, the positions and postures of the probes can be adjusted at a high precision. Furthermore, since the proximal ends of the plurality of flying leads are fixed to the printed circuit board, it is possible to improve the work performance of a process of connecting the distal ends of the flying leads to the electrodes.

BRIEF DESCRIPTION OF THE DRAWINGS

FIGS. 5A1, 5B1 and 5C1 are cross sectional views showing examples of a junction structure of a probe unit and a probe base according to embodiments of the invention, and FIGS. 5A2, 5B2 and 5C2 are plan views corresponding to FIGS. 5A1, 5B1 and 5C1.

FIGS. 6A1, 6B1 and 6C1 are cross sectional views showing examples of a junction structure of a probe unit and a probe base according to embodiments of the invention, and FIGS. 6A2, 6B2 and 6C2 are plan views corresponding to FIGS. 6A1, 6B1 and 6C1.

FIGS. 8A to 8C are cross sectional views showing examples of the

FIGS. 8A to 8C are cross sectional views showing examples of the probe head according to embodiments of the invention.

DESCRIPTION OF THE PREFERRED EMBODIMENTS

Embodiments of the invention will be described with reference to the accompanying drawings.

(Overall Structure of Probe Card)

Figure 1:
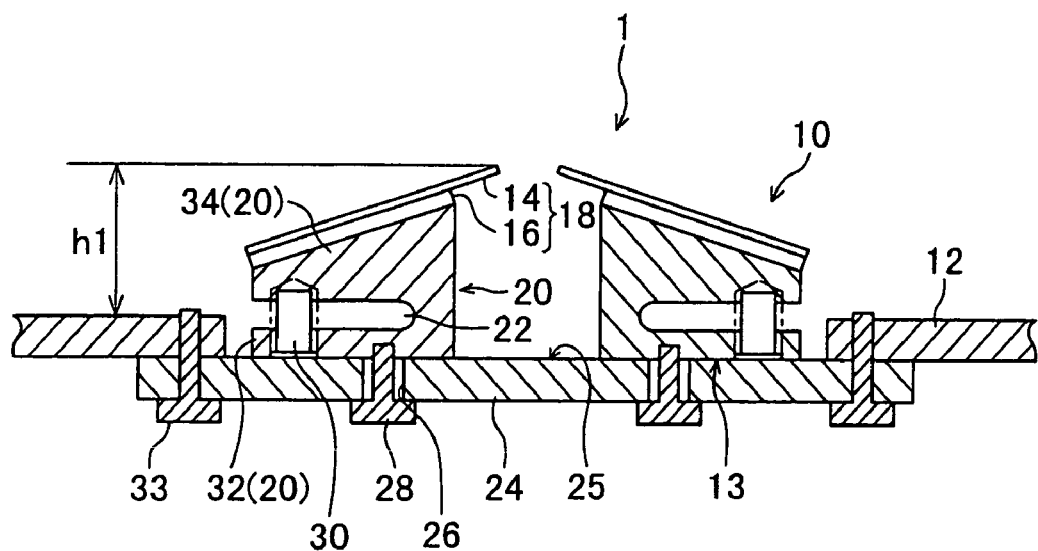
FIG. 1 is a cross sectional view of a probe card according to an embodiment of the invention.
Figure 2:
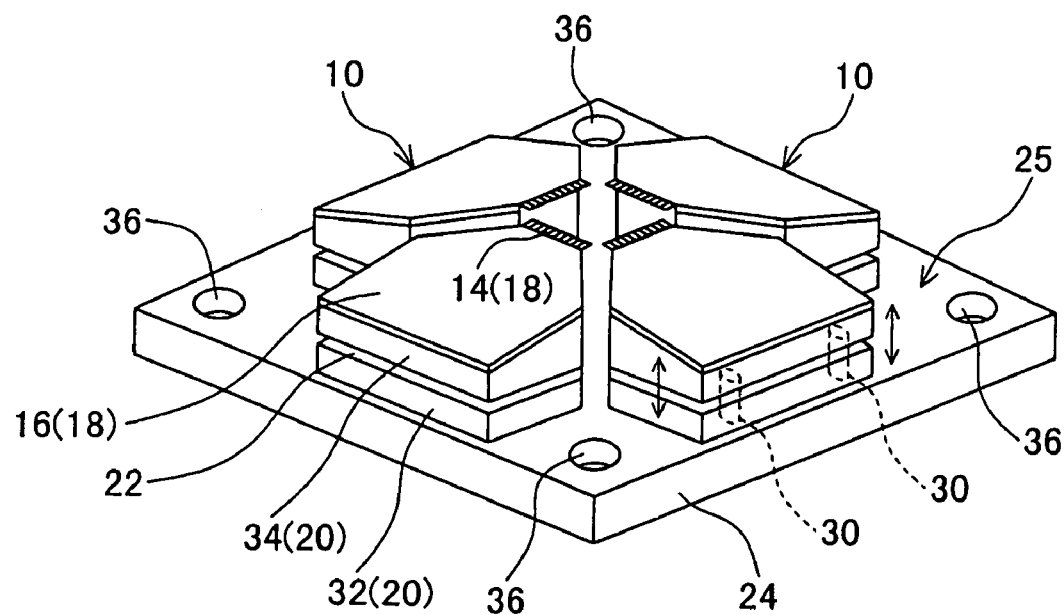
FIG. 2 is a perspective view of a probe head according to the embodiment of the invention.
Figure 3:
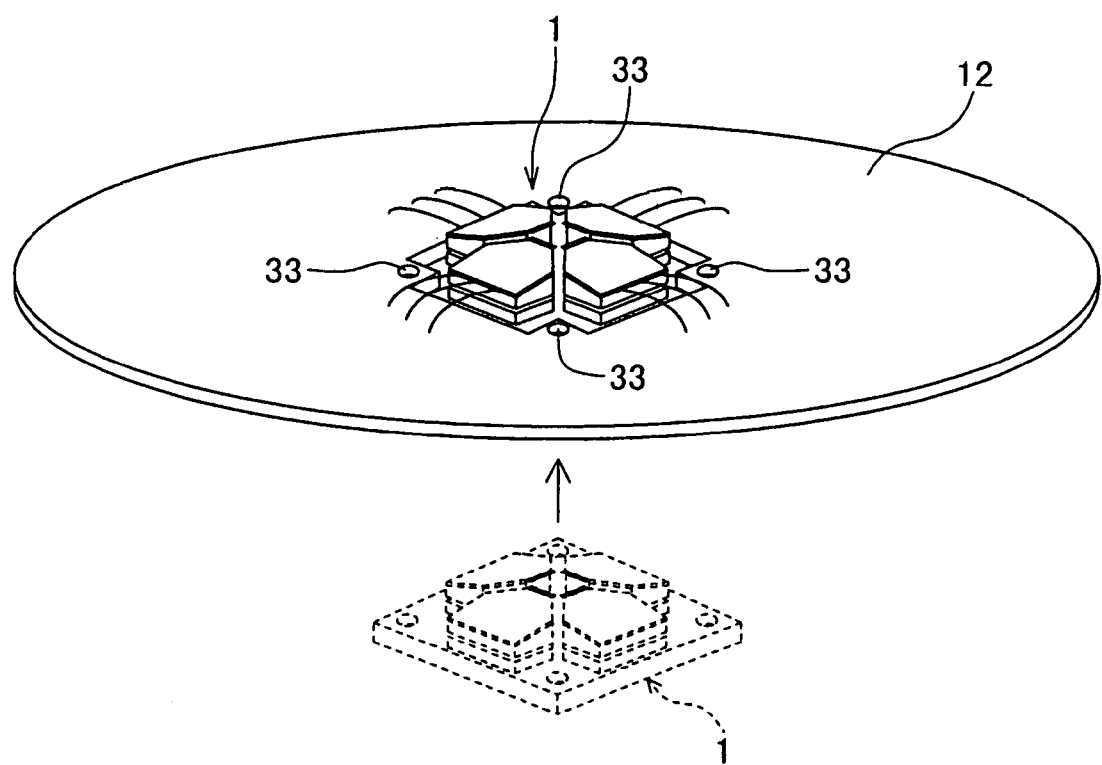
FIG. 3 is a perspective view of the probe card according to the embodiment.

FIG. 1 is a cross sectional view of a probe card, FIG. 2 is a perspective view of a probe head 1 of the probe card and FIG. 3 is a perspective view of the probe card, according to an embodiment of the invention. The probe card is mounted on an inspection instrument (prober) which inspects the electric characteristics of electronic devices such as a semiconductor integrated circuit and a liquid crystal panel. The probe card has a number of probes 14 to be made in contact with the electrodes of an electronic device. The probe head 1 is fixed to a printed circuit board 12 with screws 33. The print circuit board 12 electrically connects an inspection circuit of a prober main system to the probes 14. A spacer (not shown) may be inserted between the probe head 1 and printed circuit board 12 to adjust the height h1 from the surface of the printed circuit board 12 to the distal ends of the probes 14.

The probe head 1 has: a plurality of probe units 18 disposed with a number of probes 14; a plurality of probe bases 20 for supporting the probe units 18; and a table 24 for supporting the probe bases 20. A set of the probe unit 18 and probe base 20 is hereinafter called a probe set 10. The probe bases 20 and table 24 function as an adjusting means.

(Probe Unit)

The probe unit 18 has a number of probes 14 and a support 16 for supporting the probes 14. A plurality of probe units 18 are provided in correspondence with the layout of an electrode group of an electronic device. The probes 14 are disposed on the support 16 in correspondence with the layout pattern of electrodes of the electronic device. Each probe 14 is made of copper, tungsten, nickel-iron alloy or the like. For example, the probe is made of a copper thin film or the like processed by photolithography to have a micro pattern. The support 16 is made of ceramic, resin film, silicon thin film, metal thin film or the like. The support 16 and probes 14 are made in tight contact by using adhesive or a thin film fabrication process. Since the support 16 has a rigidity, the layout of the probes can be fixed and the whole probes 14 disposed at a narrow pitch can be handled in unison.

(Probe Set)

Figure 4A:
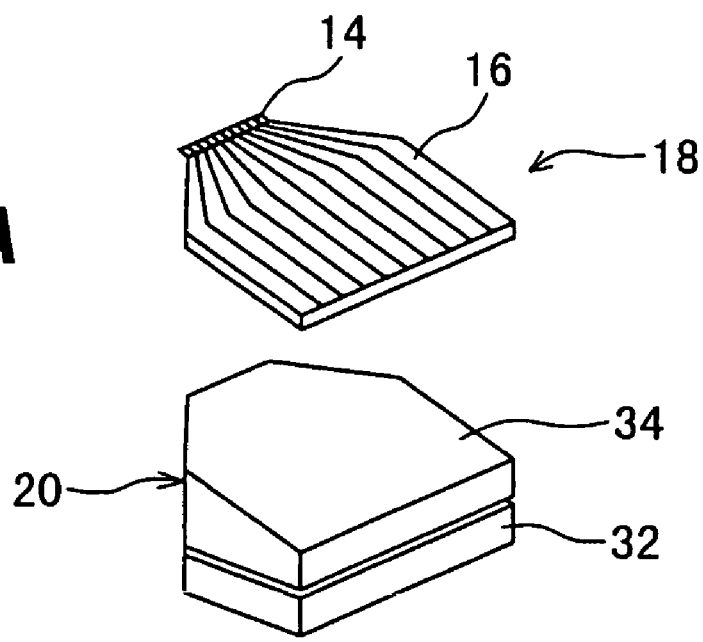
FIGS. 4A to 4C are perspective views showing probe bases and a probe unit according to embodiments of the invention.
Figure 4B:
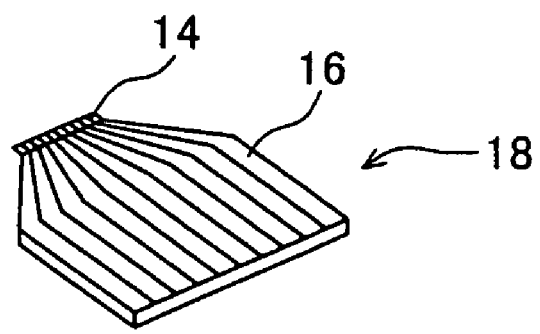
Figure 4C:
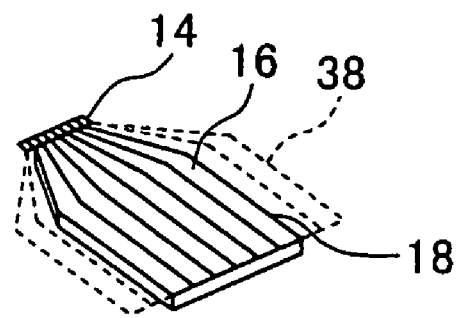

As shown in FIGS. 4A, 4B and 4C, the probe unit 18 is fixed to the probe base 20, for example, by adhesive. When the probe unit 18 and probe base 20 are adhered, a relative position thereof is not required to have a high precision, because an assembly process to be later described adjusts the position of the probe unit 18 of each probe set 10. Since the probe unit 18 and probe base 20 are made discrete, it is possible to design the probe unit 18 suitable for each inspection object electronic device and to standardize the probe base 20. For example, if a pitch of electrodes of an inspection object is narrow, a probe unit 18 such as shown in FIG. 4A is used having a narrow pitch of probes 14. If a pitch of electrodes of an inspection object is broad, a probe unit 18 such as shown in FIG. 4B is used having a broad pitch of the probes 14. The probe unit can 18 can be standardized. For example, as shown in FIG. 4C, a standard probe unit 38 is used having probes 14 same in number as the maximum expected number of electrodes of an inspection object. When an actual inspection object is decided, the sides of the standard probe unit 38 are cut, cleaved, or etched to form a probe unit 18 which matches the inspection object. By standardizing the probe unit 18 and probe base 20, the manufacture cost of the probe head 1 can be lowered. FIGS. 5A1, 5B1 and 5C1 and FIGS. 6A1, 6B1 and 6C1 are cross sectional views showing other embodiments of the junction structure of the probe unit 18 and probe base 20, and FIGS. 5A2, 5B2 and 5C2 and FIGS. 6A2, 6B2 and 6C2 are plan views corresponding to FIGS. 5A1, 5B1 and 5C1 and FIGS. 6A1, 6B1 and 6C1, respectively. As shown in FIGS. 5A1 and 5A2, the probe unit 18 and probe base 20 may be fixed with screws 40. As shown in FIGS. 5B1 and 5B2, a reinforcing plate 44 may be mounted on the upper surface of the probe unit 18, and the probe unit 18, probe base 20 and reinforcing plate 44 are fixed with screws 42. As shown in FIGS. 5C1 and 5C2, a spacer 50 may be involved between the probe unit 18 and probe base 20, the probe unit 18 is fixed to the spacer 50 with screws 46, and the spacer 50 is fixed to the probe base 20 with screws 48. As shown in FIGS. 6A1 and 6A2, a side plate 52 may be fixed to both sides of the probe base 20 with screws 54 to adjust the position of the probe unit 18 by two side plates 52. As shown in FIGS. 6B1 and 6B2, the probe unit 18 may be made riding upon a recess 58 of the probe base 20 to fix the probe unit 18 in a curved state to the probe base 20 with screws 56. As shown in FIGS. 6C1 and 6C2, two or more probe units 18 may be fixed to one probe base 20.

Figure 7:
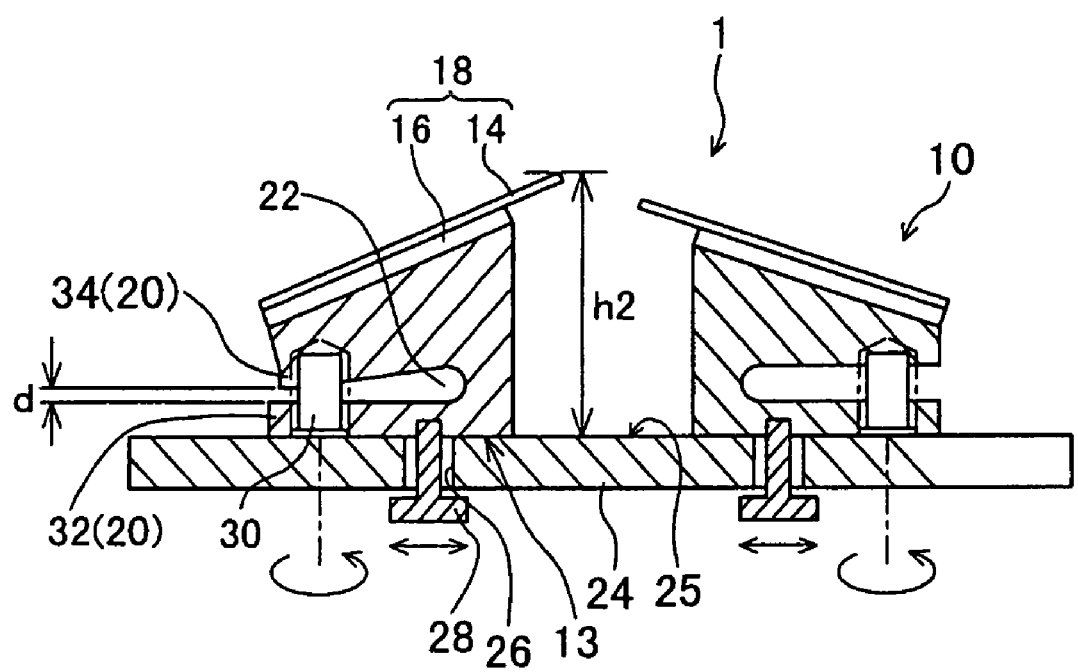
FIG. 7 is a cross sectional view of a probe head according to the embodiment of the invention.

As shown in FIG. 7, the probe base 20 is constituted of an integral body of a slide region 32 and a movable region 34. Since the slide region 32 and movable region 34 are formed integrally, the number of components can be reduced. A slit 22 is formed between the slide region 32 and movable region 34. As a width d of the slit 22 is changed, the movable region 34 moves along a direction vertical to a slide plane 13 of the slide region 32.

The slide plane 13 of the slide region 32 has a smooth surface which slides on a flat slide plane 25 of the table 24. The slide plane 13 may be a flat plane or it may be formed on three projections supporting the slide region 32 at three points. A z-direction adjusting screw 30 as the positioning means is threaded into the slide region 32 from the slide plane and passes through the slide region 32, and the top end of the screw 30 is threaded into the movable region 34. The top end of the z-direction adjusting screw 30 may only abut on the movable region 34.

The proximal region of the movable region 34 is integrally coupled to the slide region 32. The upper surface of the movable region 34 is inclined relative to the slide plane 13. As the probe unit 18 is fixed to the upper surface of the movable region 34, the axial lines of the probes 14 are fixed inclining relative to the slide plane 13. By inclining the axial lines of the probes 14 relative to the slide plane 13, the probes 14 can be inclined relative to the flat slide plane 25 of the table 24 under the condition that the probe base 20 is fixed to the table 24. It is therefore easy to contact the probes 14 to electrodes of an inspection object electronic device even if the electrodes are disposed near the central area of the device package.

The distal region of the movable region 34 is a free end. On the distal region side of the movable region 34, the top end of the z-direction adjusting screw 30 is threaded into the movable region 34. As the z-direction adjusting screw 30 is rotated, the movable region 34 is deflected so that the width d of the slit 22 can be adjusted. As the width d of the slit 22 is narrowed, the slope of the upper surface of the movable region 34 relative to the slide plane 13 becomes steep so that the top end of the probe 14 becomes high. As the width d of the slit 22 is widened, the slope of the upper surface of the movable region 34 becomes gentle so that the top end of the probe 14 becomes low. Since the proximal side of the movable region 34 is moved up and down by the z-direction adjusting screw 30, the slope angle of the upper surface of the movable region 34 can be finely adjusted. By providing each probe base 20 with two z-direction adjusting screws 30 along the layout direction of the probes 14 (direction perpendicular to the axes of the probes 14) (refer to FIG. 2), the slope angle of the axial line along the layout direction of the probes 14 can be adjusted relative to the slide plane 25 of the table 24.

Figure 8A:
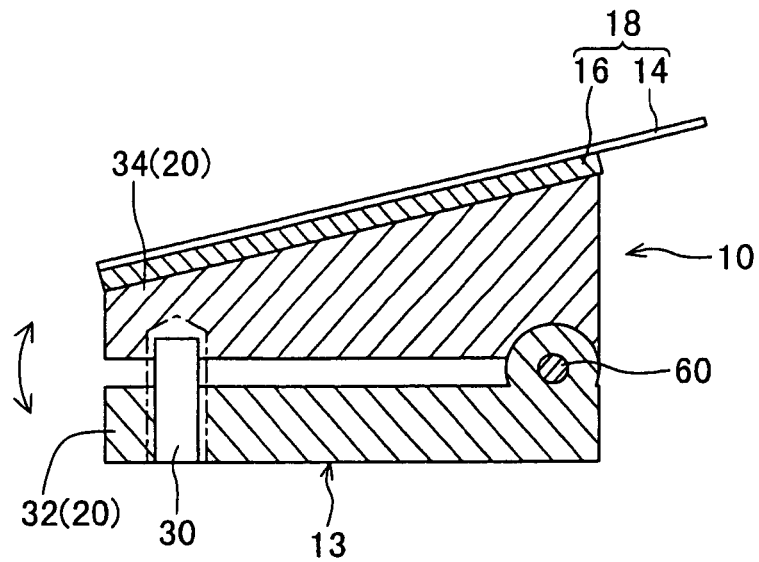
Figure 8B:
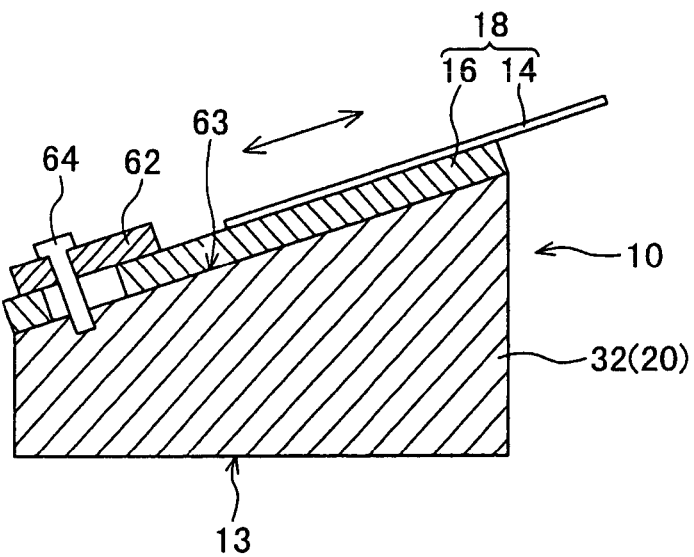
Figure 8C:
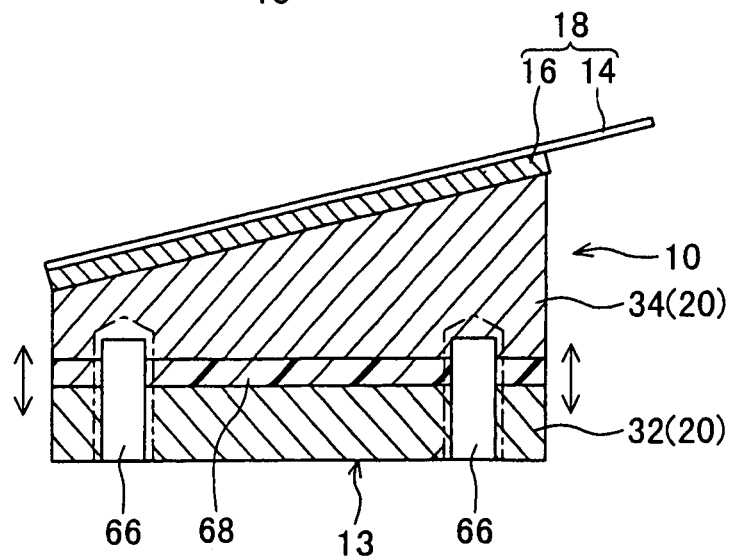
Figure 15A:
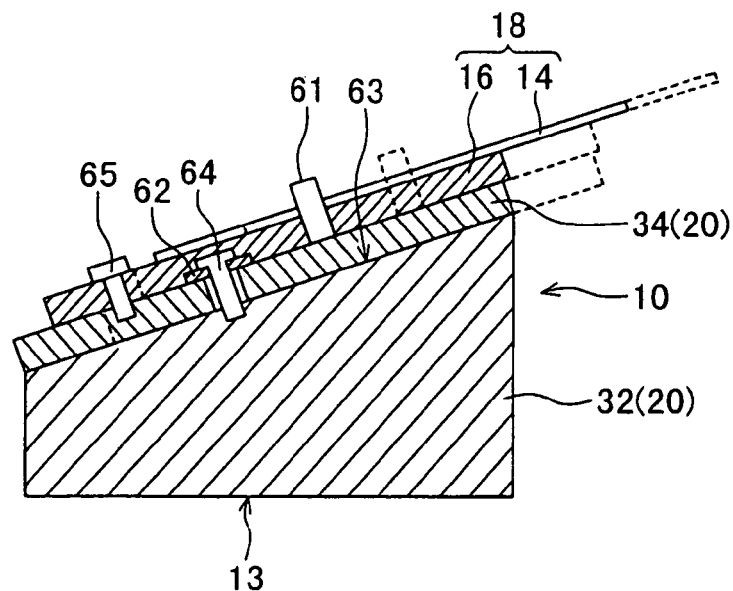
FIGS. 15A and 15B are a cross sectional view and a plan view showing a probe set according to an embodiment of the invention.
Figure 15B:
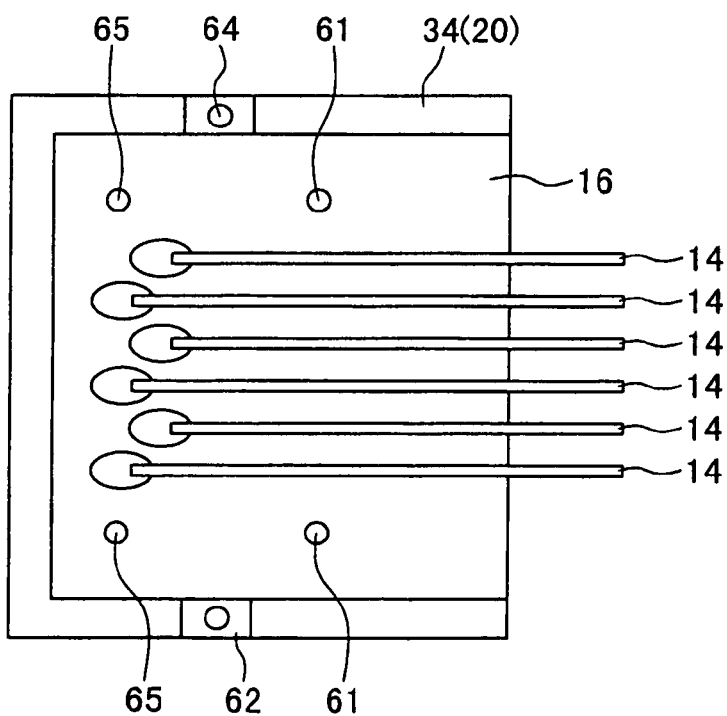

FIGS. 8A to 8C and FIG. 15A are cross sectional views showing other embodiments of the probe set 10, and FIG. 15B is a plan view of the probe set shown in FIG. 15A. As shown in FIG. 8A, the movable region 34 may be supported by a rotary shaft 60 pivotally relative to the slide region 32. By supporting the movable region 34 pivotally relative to the slide region 32, the adjustment range of the movable region 34 can be made broad. As shown in FIG. 8B, the support 16 of the probe unit 18 may be structured as a lifting unit. Namely, a slope surface 63 inclined relative to the slide plane 13 is formed on the slide region 32, and the support 16 is pushed against the slope surface 63 with screws 64, a clamp plate 62 and the like to regulate the motion direction of the support 16. The slope 63, screws 64 and clamp plate 62 guide the support 16 and the motion direction axis of the support 16 defined on a straight line inclined relative to the slide plane 13. The number of components can be reduced by making the support 16 slidable on the slide region 32 along the direction inclined relative to the slide plane 13. It is also possible to adjust the height h2 of the top end of the probe 14 while maintaining constant the slope angle of the axial line of the probe 14 relative to the slide plane 25. As shown in FIG. 8C, an adjusting plate 68 made of elastic material may be provided between the movable region 34 and slide region 32, and the movable region 34, slide region 32 and adjusting plate 68 are fixed with screws 66. The movable region 34 can be positioned without any play by incorporating the structure that the movable region 34 can be moved along a direction vertical to the slide plane 13 because of the deformation of the adjusting plate 68 provided between the movable region 34 and slide region 32.

As shown in FIGS. 15A and 15B, the support 16 of the probe unit 18 may be detachably mounted on the movable region 34 slidable along a direction inclined relative to the slide plane 13. Namely, a slope 63 inclined relative to the slide plane 13 is formed on the slide region 32, and the movable region 34 is pushed against the slope 63 with screws 64, a clamp plate 62 and the like (refer to FIG. 8B) to regulate the motion direction of the movable region 34, and the movable region 34 is provided with an engaging unit which is constituted of: positioning pins 61 to be inserted into through holes formed through the support 16; a positioning guide; and the like. Screws 64 fix the support 16 to the movable region 34 (probe base 20).

The through holes of the support 16 into which the positioning pins 61 are inserted are desired to be formed at a high size precision by using lithography patterning. The detachable structure of the probe unit 18 may be applied to the lift unit having a different structure such as shown in FIG. 8B.

Figure 9A:
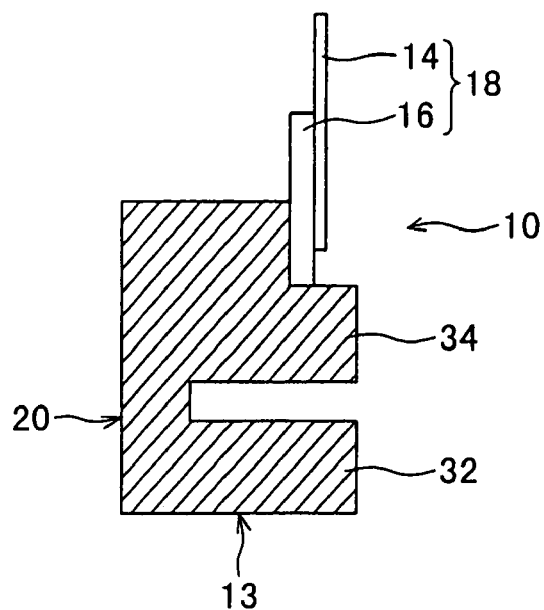
FIGS. 9A to 9C are cross sectional views showing examples of the probe head according to other embodiments of the invention.
Figure 9B:
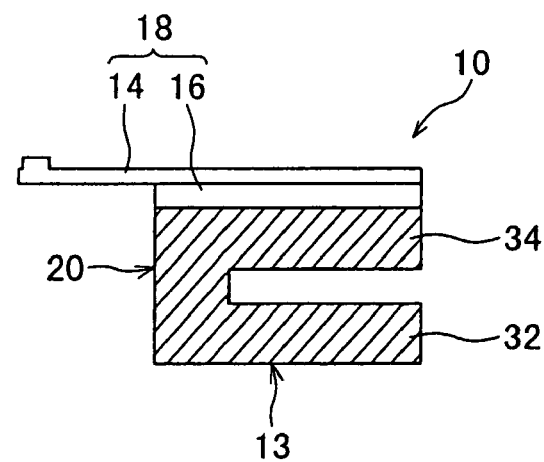
Figure 9C:
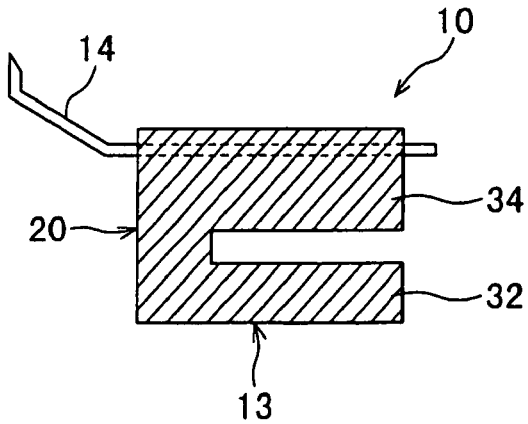

FIGS. 9A to 9C are side views showing other embodiments of the probe set 10. As shown in FIG. 9A, the probe unit 18 may be fixed to the probe base 20 in such a manner as the axial lines of the probes 14 become vertical to the slide plane 13. As shown in FIG. 9B, the probe unit 18 may be fixed to the probe base 20 in such a manner as the axial lines of the probes 14 become parallel to the slide plane 13. As shown in FIG. 9C, each probe 14 made of tungsten or the like may be inserted directly into the probe base 20.

(Table)

The table 24 is a high rigidity flat plate member for supporting a plurality of probe sets 10 as shown in FIG. 1, and is used for fixing the relative positions of the probe sets. The table 24 has a flat slide plane 25 on which the probe sets 10 are placed. Since the flatness of the flat slide plane 25 directly influences the z-direction positioning precision of the probes 14, it is desired to form the flat slide plane 25 to have as flat a mirror surface as possible. The table 24 is not limited only to a flat plate member, but it may have a plurality of flat slide planes which are formed stepwise and parallel. The table 24 is fixed to the printed circuit board 12 with screws 33 or the like.

Figure 21:
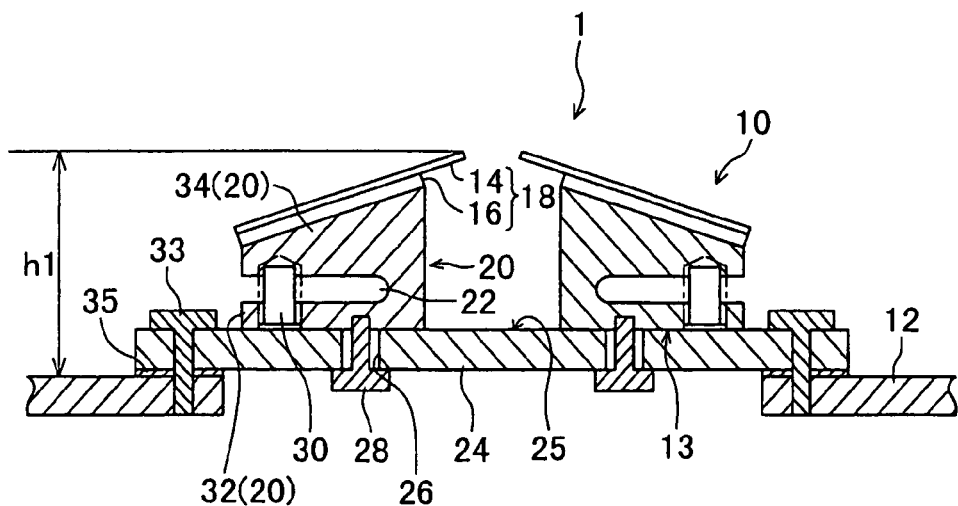
FIG. 21 is a cross sectional view of the probe card according to another embodiment of the invention.

The table 24 may be positioned on the bottom side of the printed circuit board 12 as shown in FIG. 1 or it may be positioned on the top side of the printed circuit board 12 as shown in FIG. 21. The table 24 is assembled either on the bottom side or top side of the printed circuit board 12 in order to facilitate to set the precision in conformity with the prober specification. In both the assembly on the bottom and top sides, the height h1 of the top end of each probe 14 from the upper surface of the printed circuit board 12 can be adjusted by a spacer 35 (refer to FIG. 21) or the like.

(Wirings)

Figure 10A:
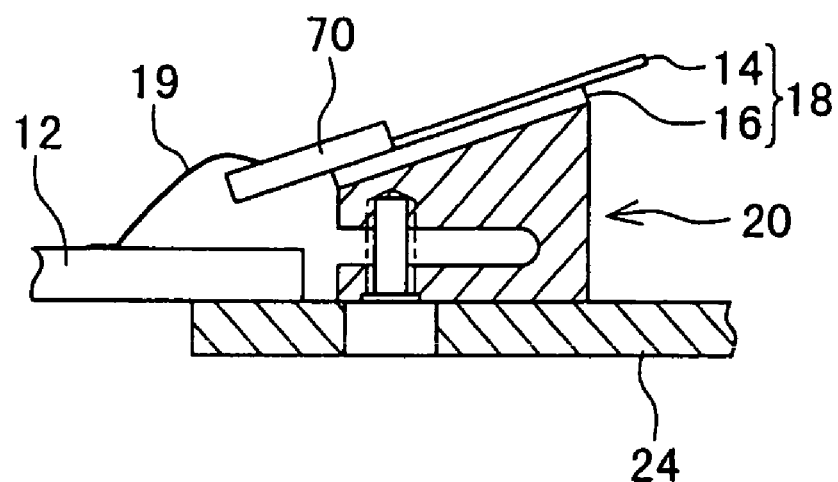
FIGS. 10A and 10B are a cross sectional view and a plan view showing the wiring state between a printing circuit board and a probe unit according to the embodiment.
Figure 10B:
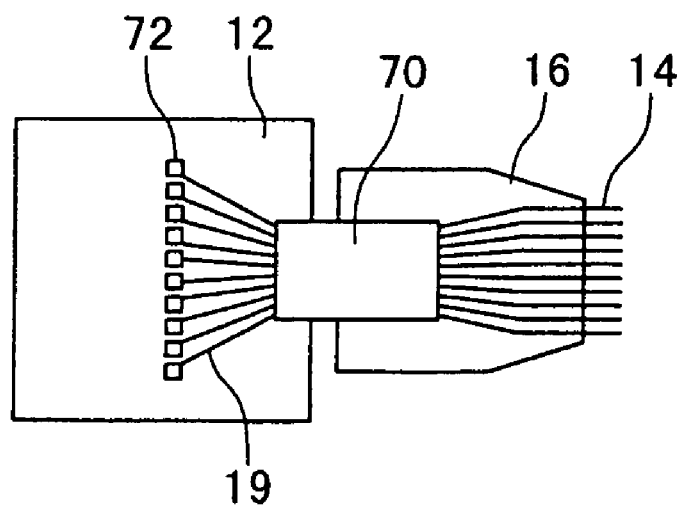
Figure 11A:
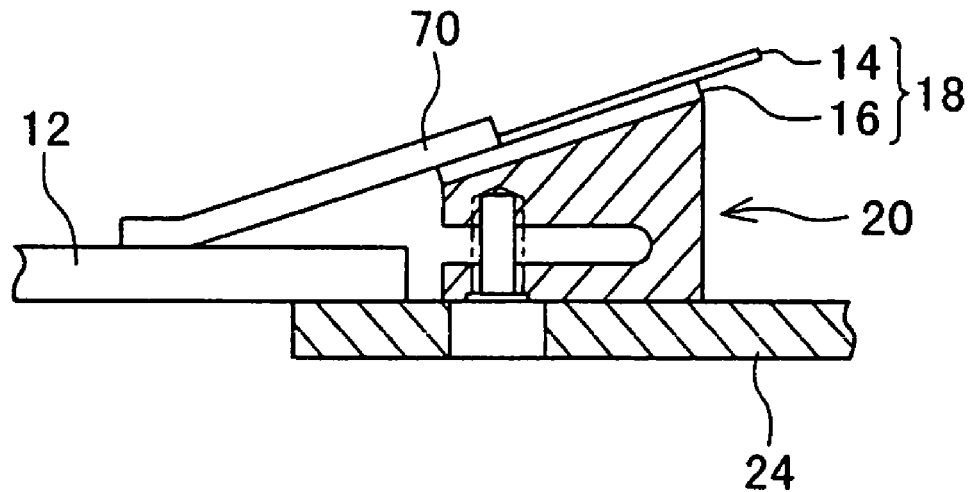
FIGS. 11A and 11B are a cross sectional view and a plan view showing the wiring state between a printing circuit board and a probe unit according to another embodiment of the invention.
Figure 11B:
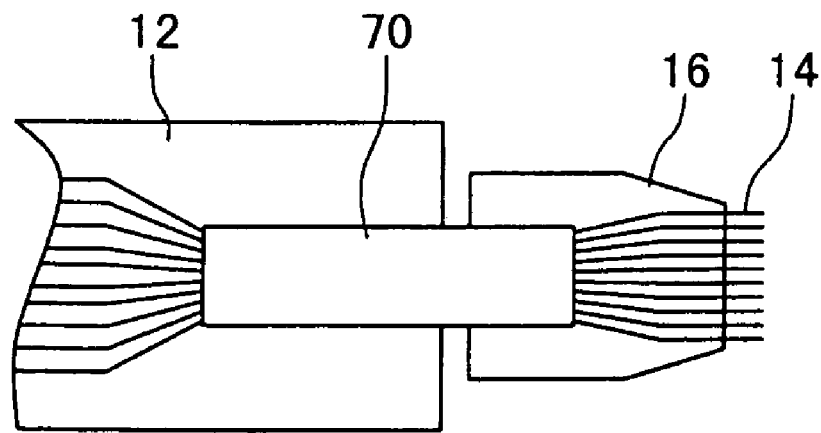
Figure 12A:
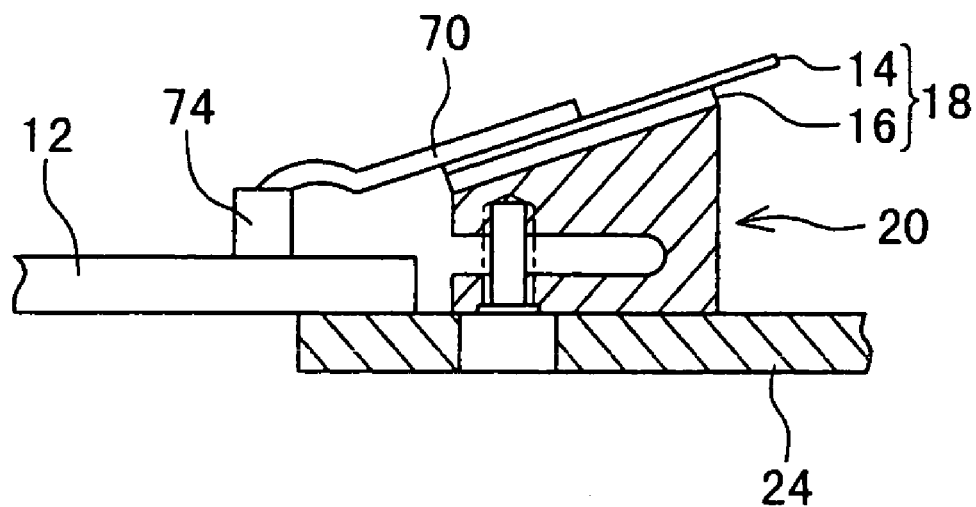
FIGS. 12A and 12B are a cross sectional view and a plan view showing the wiring state between a printing circuit board and a probe unit according to another embodiment of the invention.
Figure 12B:
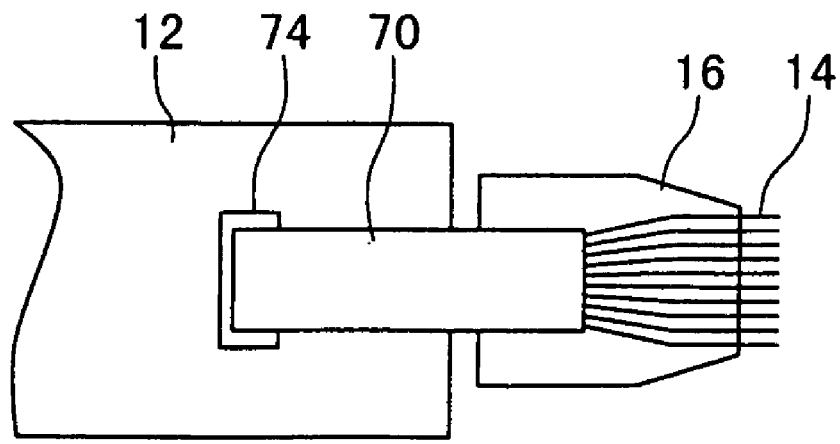
Figure 22A:
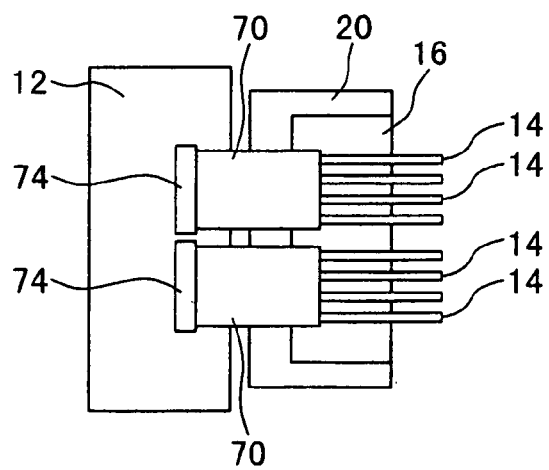
FIGS. 22A and 22B are a plan view and a cross sectional view showing the wiring state between a printing circuit board and a probe unit according to another embodiment of the invention.
Figure 22B:
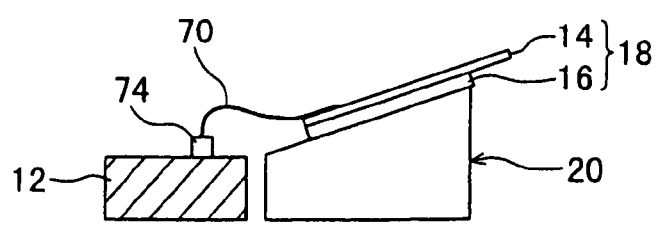

FIGS. 10A, 11A and 12A are cross sectional views showing the wiring states between the printed circuit board 12 and probe unit 18, and FIGS. 10B, 11B and 12B are plan views of the wiring states shown in FIGS. 10A, 11A and 12A. As shown in FIGS. 10A and 10B, the probes 14 and a flexible printed circuit (FPC) board 70 may be connected by an unrepresented anisotropic conductive film (ACF), and FPC 70 and the electrodes 72 of the printed circuit board 12 are connected by solder. As shown in FIGS. 11A and 11B, the probes 14 and printed circuit board 12 may be connected by using FPC 70 and ACF without using wires. As shown in FIGS. 12A and 12B, the probes 14 and FPC 70 may be connected by ACF, and FPC 70 and printed circuit board 12 are connected by a connector 74. If the number of probes 14 of each probe unit 18 is large, a plurality of FPCs 70 may be connected to each probe unit 18 as shown in FIGS. 22A and 22B. With this arrangement, FPC 70 can be standardized. By narrowing the width of each of a plurality of FPCs 70, the influence upon a wiring pattern formed on the printed circuit board 12 can be mitigated, which is caused by expansion and contraction of the flexible printed circuit board when FPC 70 is joined to the printed circuit board 12 via ACF through heating. This facilitates to design the wiring pitch of FPC 70 by taking into consideration the expansion and contraction of the flexible printed circuit board.

Figure 16A:
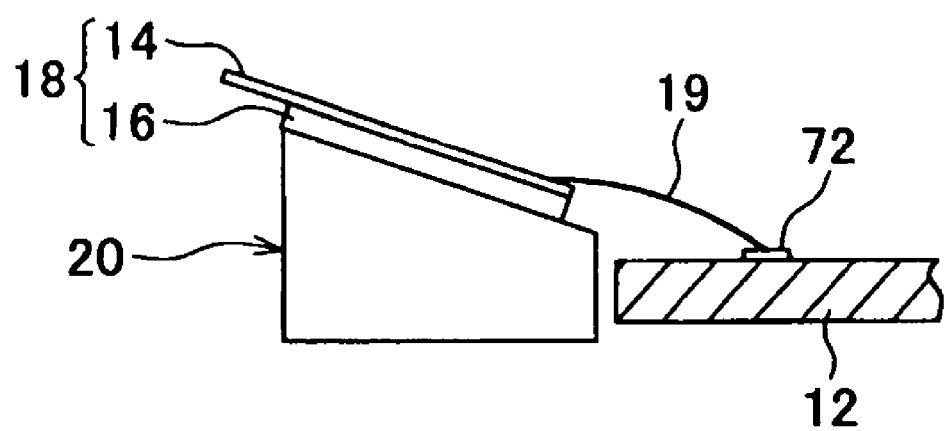
FIGS. 16A and 16B are a cross sectional view and a plan view showing the wiring state between a printing circuit board and a probe unit according to another embodiment of the invention.
Figure 16B:
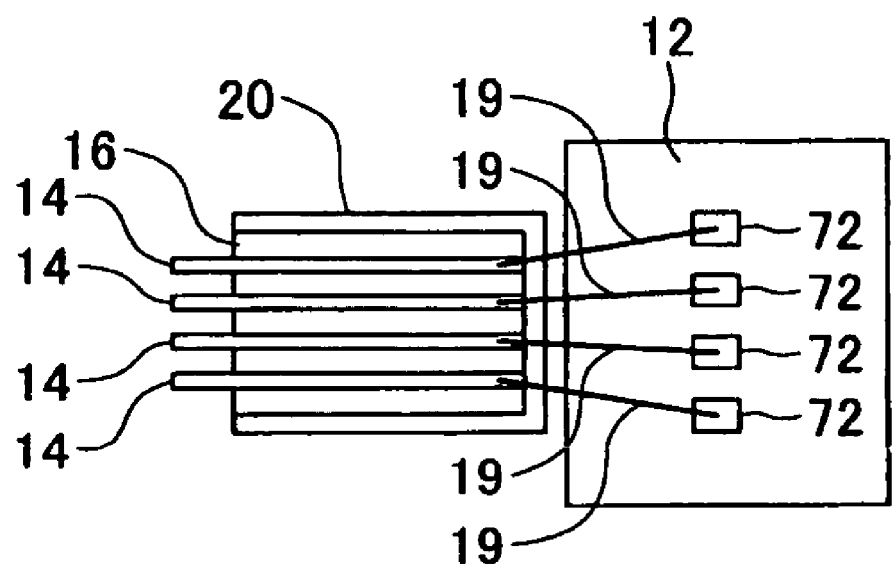

As shown in FIGS. 16A and 16B, the probes 14 and the electrodes 72 of the printed circuit board 12 may be connected by wires 19. The wire 19 may be a covered Au wire, a bare Au wire, or an Al wire. The covered Au wire is suitable for the case of a large number of wires. The bare Au wire is suitable for lowering a wiring resistance. The Al wire is suitable for the probes 14 having a fine pitch.

The ends of each wire 19, a corresponding probe 14 and a corresponding electrode of the printed circuit board 12 are joined by bonding, solder or low resistance welding. Both ends of each wire 19 in a slightly bent state are fixed to the corresponding probe 14 and the corresponding electrode of the printed circuit board 12. With this arrangement, the relative position of the probes 14 and printed circuit board 12 can be changed omnidirectionally even after the assembly of the probe card. Since the electric resistance of the wire 19 is smaller than that of FPC, the wiring resistance of the probe card can be lowered. If the printed circuit board 12 is deformed due to a temperature change, the wire 19 is also deformed so that the deformation of the printed circuit board 12 can be absorbed. It is therefore possible to prevent the positions of the probes 14 from being changed by the deformation of the printed circuit board 12.

FPC 70 and wires 19 electrically connecting the probes 14 and printed circuit board 12 are preferably covered with an electromagnetic shield film in order to improve electromagnetic compatibility (EMC).

Figure 17A:
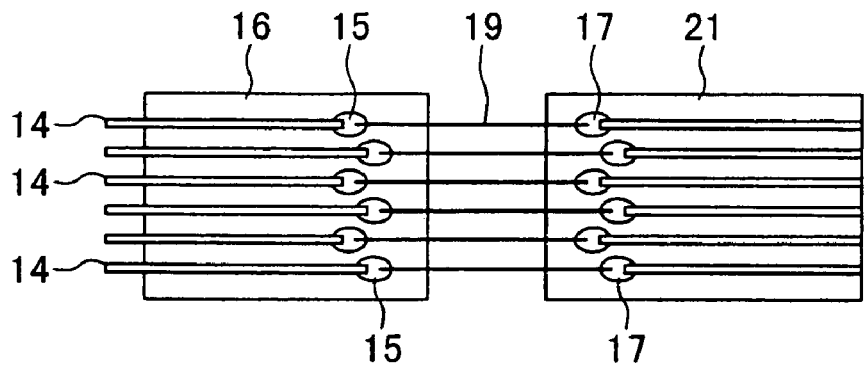
FIGS. 17A, 17B and 17C are a plan view and cross sectional views showing the wiring state between a printing circuit board and a probe unit according to embodiments of the invention.
Figure 17B:
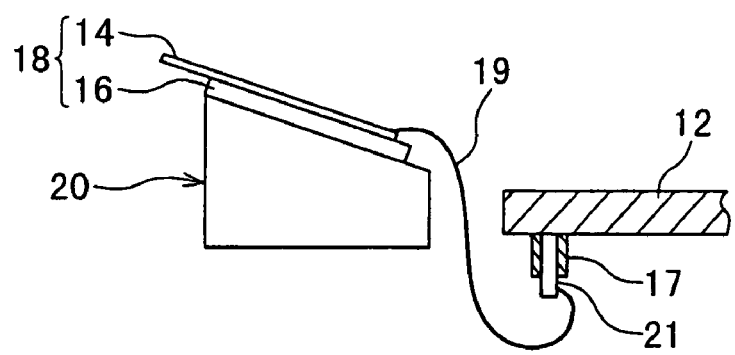
Figure 17C:
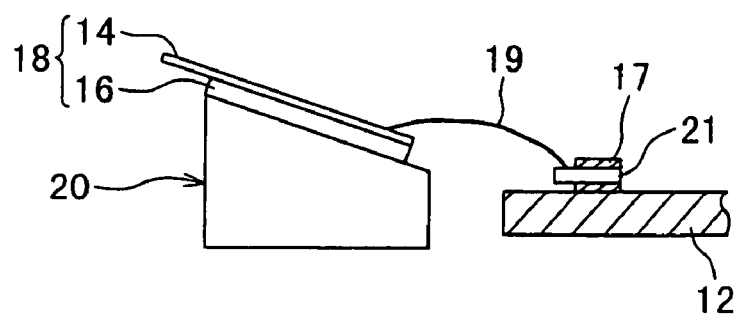

As shown in FIG. 17A, the probes 14 and wirings of an auxiliary substrate may be connected by wires 19, and as shown in FIGS. 17B and 17C, the auxiliary substrate 21 may be connected to a connector 17 mounted on the printed circuit board 12. The ends of each wire 19, a corresponding probe 14 and a corresponding electrode of the auxiliary substrate 21 are joined by bonding, solder or low resistance welding. Since the auxiliary substrate 21 is used, the work performance of the whole assembly process of the probe head 1 can be improved, and the work performance of a replacement work when the probe 14 is broken can be improved.

Figure 18A:
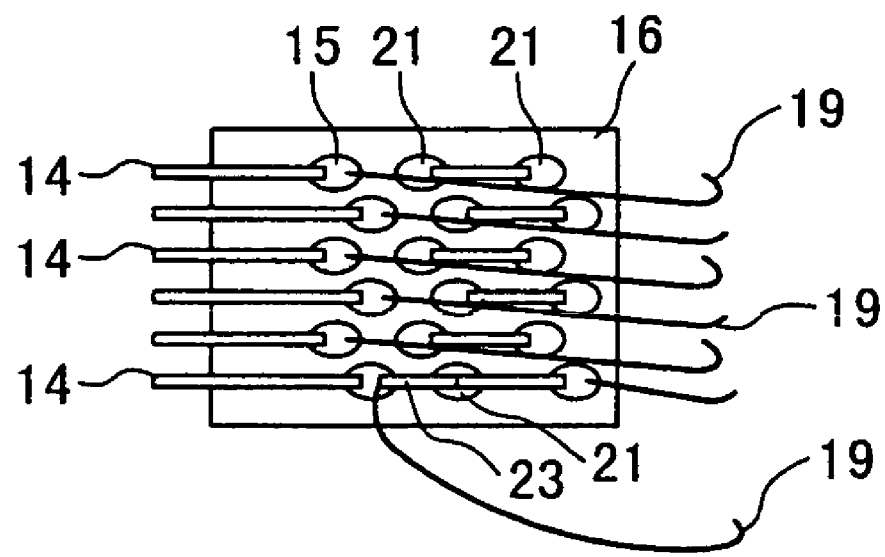
FIGS. 18A and 18B are a plan view and a cross sectional view showing the wiring state between a printing circuit board and a probe unit according to another embodiment of the invention.
Figure 18B:
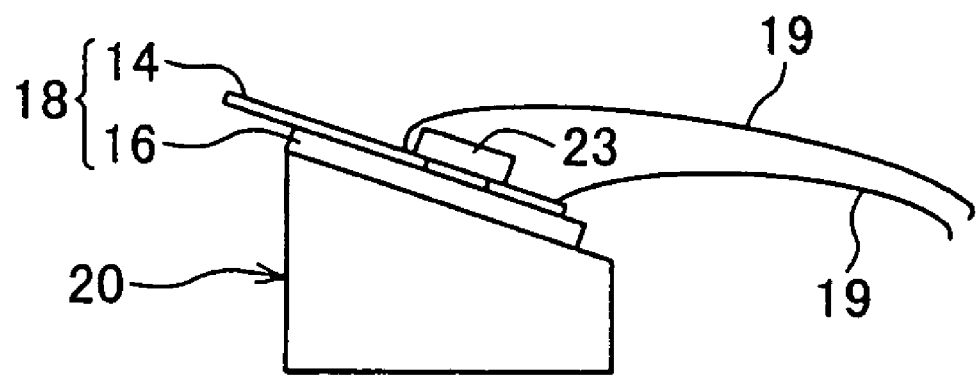

As shown in FIGS. 18A and 18B, electrode pads 15 for the probes 14 and lands 2, X for mounting electronic components may be formed on the surface of the support 16. By using the lands 21 on the support 16, chip components 23 such as a noise elimination capacitor can be mounted near the top ends of the probes 14 to conduct noise elimination near at the top ends of the probes 14.

Figure 19A:
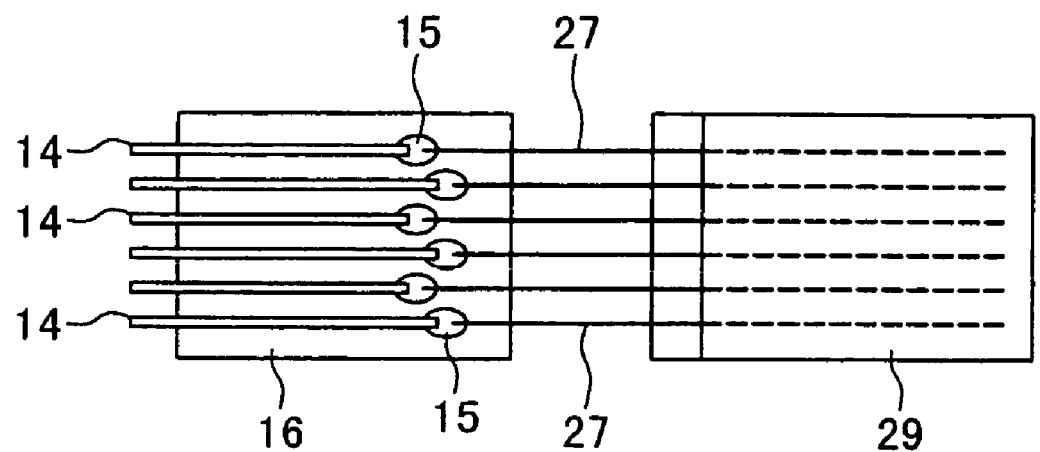
FIGS. 19A and 19B are a plan view and a cross sectional view showing the wiring state between a printing circuit board and a probe unit according to another embodiment of the invention.
Figure 19B:
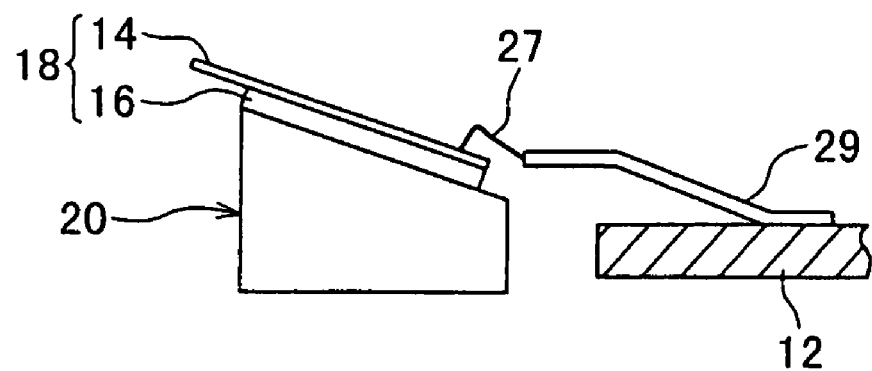

As shown in FIGS. 19A and 19B, the probes 14 and printed circuit board 12 may be connected by FPC 29 having flying leads 27. The top ends of the flying leads 27 in a slightly bend state are fixed to the probes 14 or printed circuit board 12. The relative position of the probes 14 and printed circuit board 12 can therefore be changed omnidirectionally even after the assembly of the probe card. Since the flying leads 27 are collectively coupled to the main body of FPC 29, the work performance of a junction process between the flying leads 27 and the probes 14 or printed circuit board 12 can be improved. The number of wiring connections can be reduced more than when both the ends of each wire are connected to the corresponding probe 14 and the corresponding electrode of the printed circuit board 12.

Figure 23A:
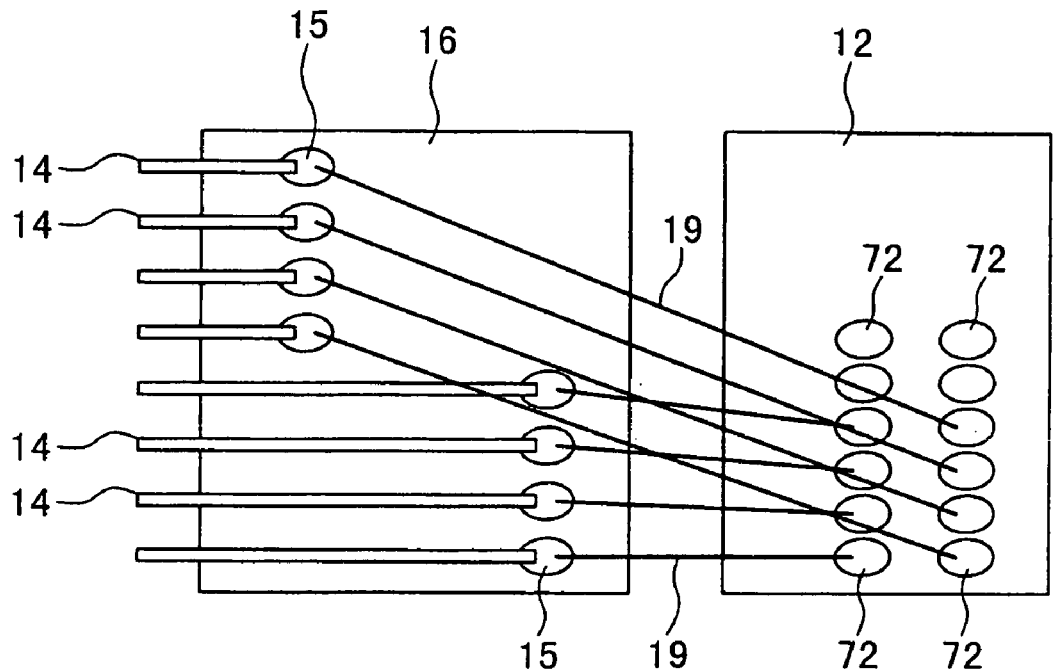
FIGS. 23A and 23B are a plan view and a cross sectional view showing the wiring state between a printing circuit board and a probe unit according to another embodiment of the invention.
Figure 23B:
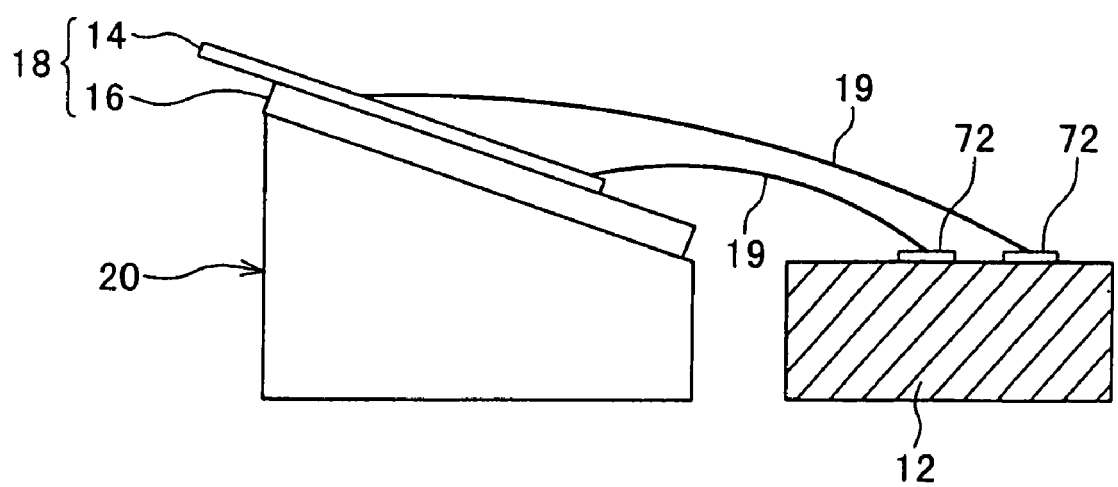

As shown in FIGS. 23A and 23B, a plurality of electrode pads 15 for connecting wires 19 may be formed at positions of the wires 19 having different heights from the printed circuit board 12 in the assembly state of the probe card. It is therefore possible to prevent crossing of the wires 19 so that electric short between the wires and noise generation can be prevented. The work performance of the junction process for the wires 19 can be improved.

Figure 20A:
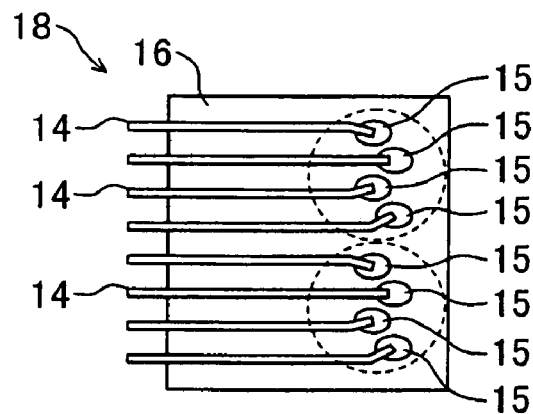
FIGS. 20A to 20C are plan views showing examples of a wiring pattern on a support according to embodiments of the invention.
Figure 20B:
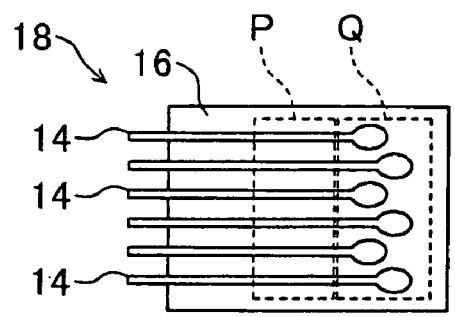
Figure 20C:
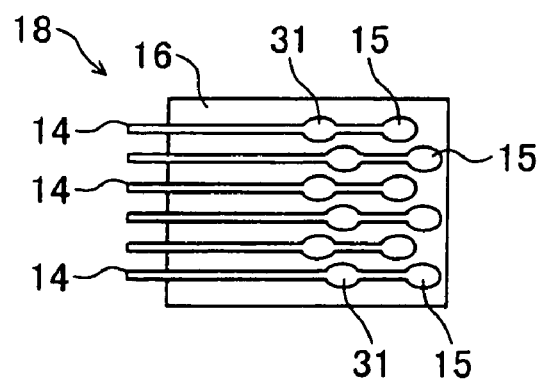

FIGS. 20A, 20B and 20C are plan views of a wiring pattern formed on the surface of the support 16.

As shown in FIG. 20A, a predetermined number of electrode pads 15 of the probes 14 may be disposed collectively. As the number of wirings increases, in a process of coating reinforcing resin on the wiring junction areas, the resin becomes likely to flow into the area unnecessary for reinforcement. By collectively disposing the electrode pads 15 and reinforcing the collections of the electrode pads 15 with resin, it becomes easy to locally reinforce only the necessary areas.

As shown in FIG. 20B, a junction area P for FPC and a junction area Q for wires may be formed for probes 14. In the junction area for FPC, the probes are formed at a pitch corresponding to the pitch of electrodes of FPC. In the junction area for the wires, electrode pads 15 are formed for the connection to the wires 19. By forming the junction area P for FPC and the junction area Q for the wires, the general purpose use can be improved.

As shown in FIG. 20C, an electrode pad 15 for connecting a wire and an inspection pad 31 may be formed for each probe 14. When the electric characteristics of the probe unit 18 are inspected, if other inspection probes are made in contact with the electrode pads 15 for connecting wires, the surfaces of the electrode pads 15 are contaminated, which may cause a connection defect between the electrode pad 15 and wire. When the electric characteristics of the probe unit 18 are inspected, the inspection probes are made in contact with the inspection pads 31 different from the electrode pads 15 so that the contamination of the surfaces of the electrode pads 15 can be prevented. By standardizing the pitch and size of the inspection pads 31, the inspection process for the probe unit 18 can be standardized.

Figure 24A:
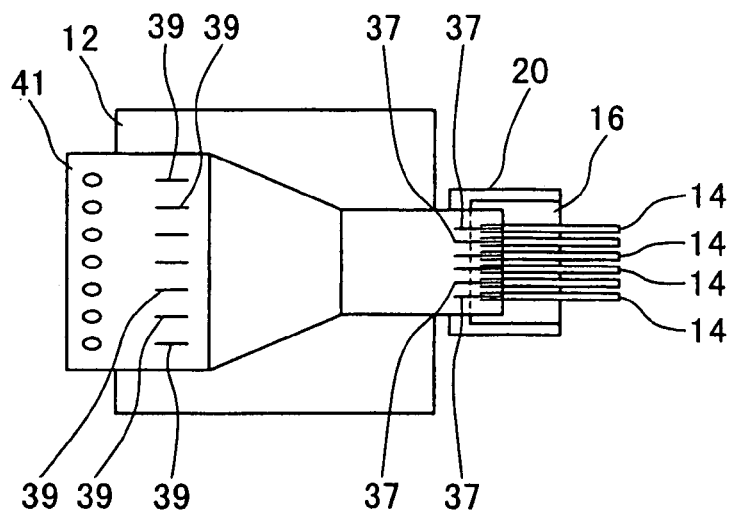
FIGS. 24A to 24C are plan views and a cross sectional view showing the wiring state between a printing circuit board and a probe unit according to another embodiment of the invention.
Figure 24B:
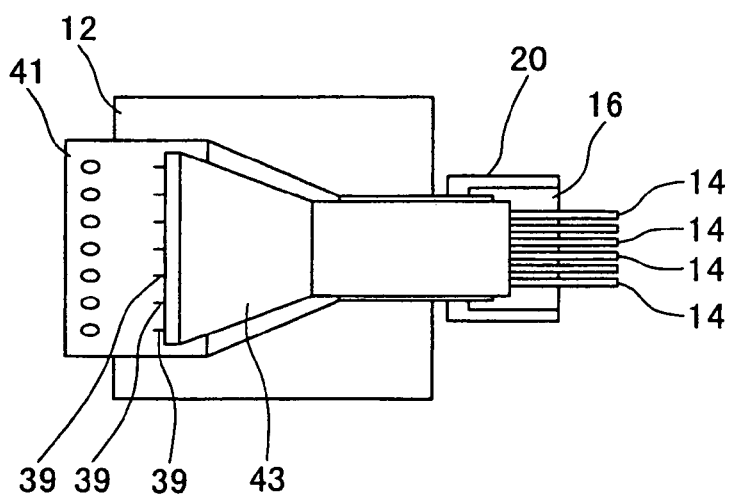
Figure 24C:
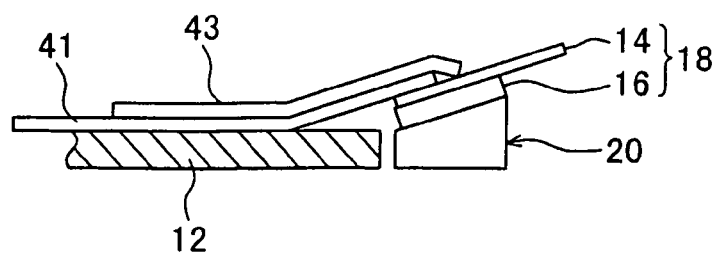

As shown in FIGS. 24B and 24C, a plurality of FPCs may be overlaid to connect the probes 14 and printed circuit board 12. Specifically, as shown in FIG. 24A, parallel wiring pads are formed on an upper surface of a lower FPC 41 on both sides of the probes and printed circuit board. The parallel wiring pads 37 on the probe side and parallel wiring pads 39 on the printed circuit board side are electrically connected by an upper FPC 43 as shown in FIGS. 24B and 24C. Since the total resistance of FPC 41 and FPC 43 is lower than that of a single FPC, the wiring resistance of the probe card can be lowered. Since the wiring is made parallel by overlaying FPCs, the wiring process is not made too complicated even if the parallel wiring is utilized.

Figure 25A:
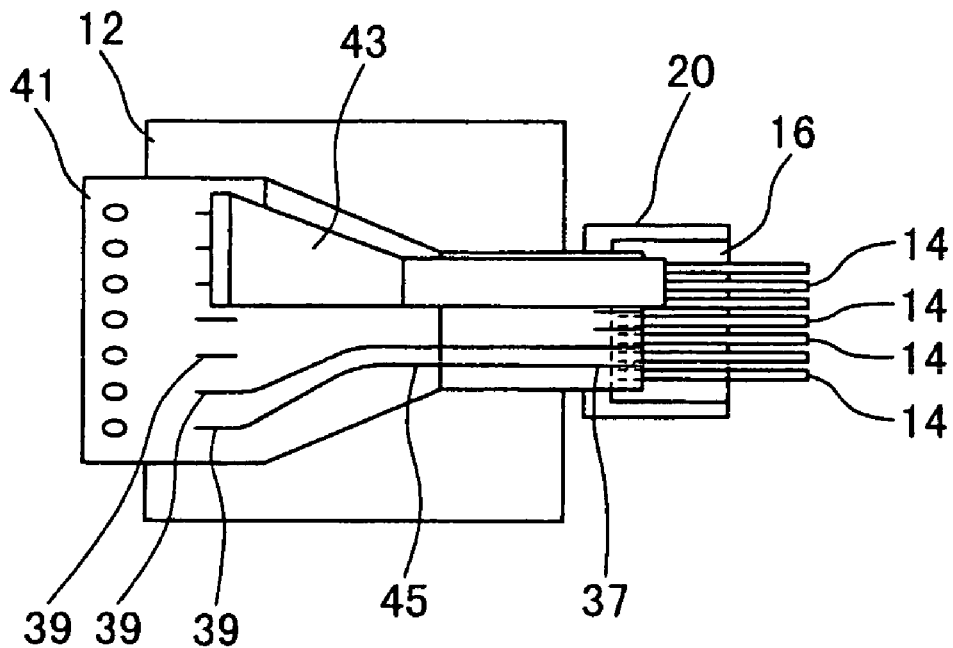
FIGS. 25A and 25B are a plan view and a cross sectional view showing the wiring state between a printing circuit board and a probe unit according to another embodiment of the invention.
Figure 25B:
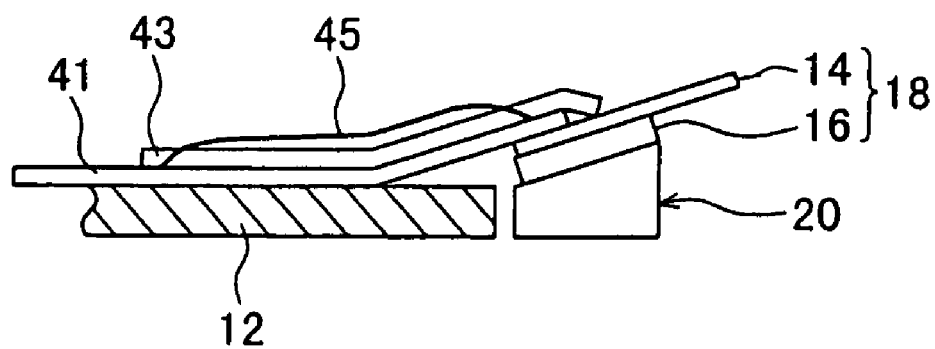

As shown in FIGS. 25A and 25B, some parallel wiring pads 37 on the probe side and some parallel wiring pads 39 on the printed circuit board side respectively on a lower FPC 41 may be electrically connected by an upper FPC 43, and some parallel wiring pads 37 on the probe side and some parallel wiring pads 39 on the printed circuit board side respectively on the lower FPC 41 are electrically connected by wires 45. The use of the wires 45 allows the wiring resistance to be controlled independently for each probe 14. Namely, wirings can be selectively made parallel only for those probes whose wiring resistance is to be lowered. Furthermore, if wirings whose resistance is to be lowered are disposed in succession, the wirings disposed in succession can be collectively made parallel by FPC 43.

(Probe Head Assembly Apparatus)

Figure 13:
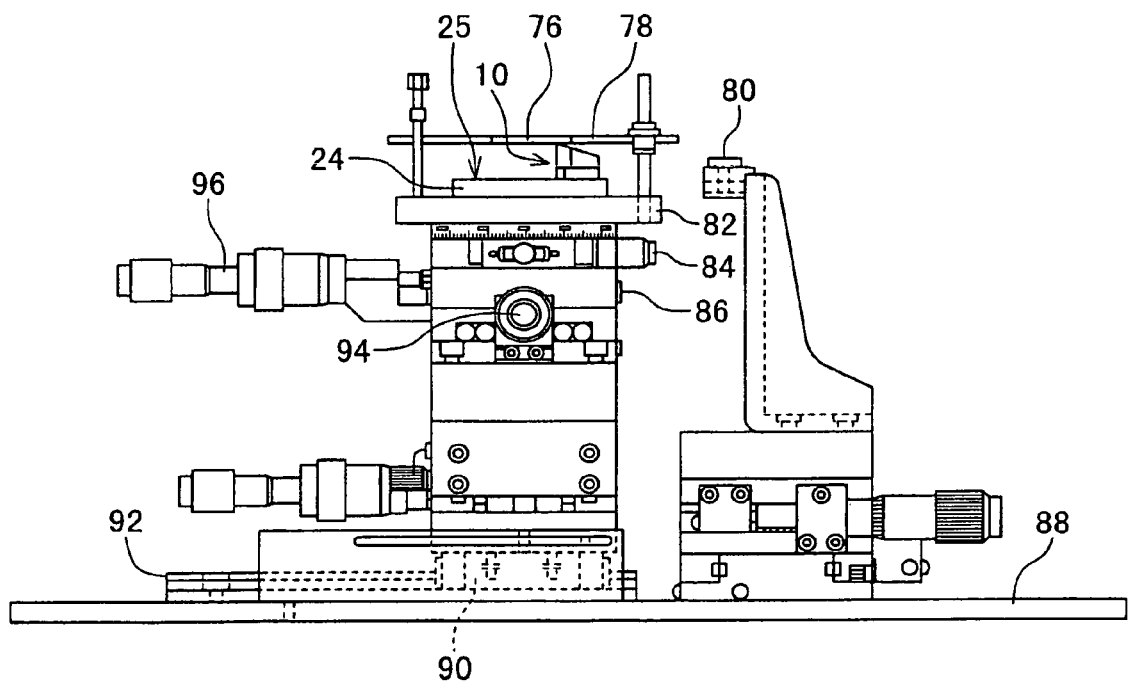
FIG. 13 is an elevational view of an assembly apparatus for a probe head according to an embodiment of the invention.

FIG. 13 is an elevational view of an assembly apparatus for the probe head 1. A base 82 on which the table 24 is placed can reciprocally move together with a slider 90 along rails 92 mounted on a floor 88. A chuck 80 for holding the probe set 10 is provided just above the longitudinal axial line of the rails 92. The base 82 reciprocally moves along an x-direction by rotating an x-direction adjusting shaft 96, reciprocally moves along a y-direction (a direction perpendicular to the drawing sheet of FIG. 13) by rotating a y-axis adjusting shaft 94, and rotates by a small angle around a z-axis direction by rotating an angle adjusting shaft 84. The base 82 can rotate by 360 degrees when the base 82 is located at a remote position (rotation area) from the chuck 80. A target holder 78 capable of reciprocal motion along the z-axis is supported by the base 82. A flat plate target 76 is held by the target holder 78 in a posture parallel to the surface of the base 82, the flat plate target being formed with the same pattern as the layout pattern of the electrodes of an inspection object electronic device. If the target 76 is made of a transparent material, a more precise position alignment and automation thereof can be made basing upon image data taken with a digital camera from the upper position of the target 76. The pattern on the target is formed, for example, through photolithography of a metal thin film such as a copper thin film formed on the surface of a transparent substrate. As the pattern of the target 76 is made of a metal thin film, misalignment between the pattern of the target 76 and the probes 14 can be inspected through conduction inspection of the pattern of the target 76 and the probes 14.

Figure 14A:
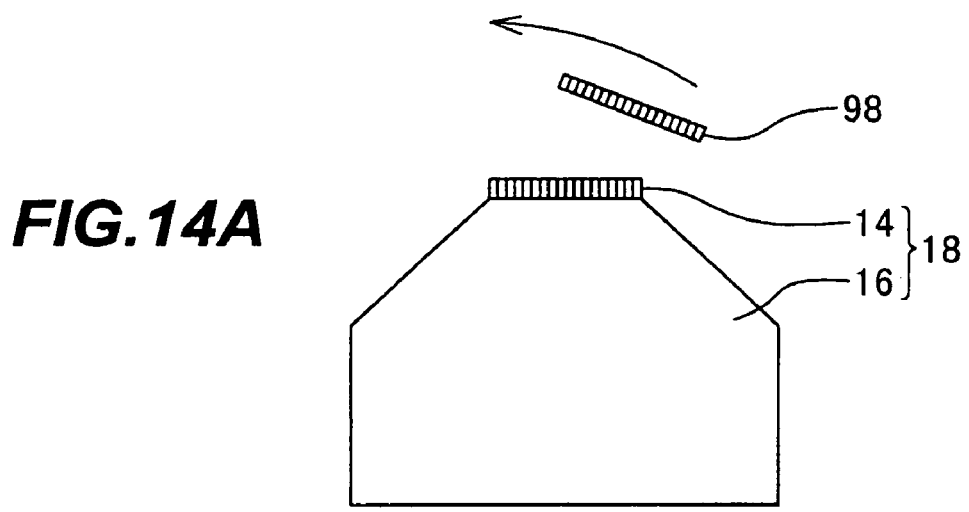
FIGS. 14A to 14C are schematic diagrams illustrating an assembly method for a probe head according to an embodiment of the invention.

As shown in FIG. 14A, it is assumed that the metal electrode pattern 98 on the target 76 and the probes 14 of the probe unit 18 can be observed through the transparent substrate. The electrode pattern 98 and the probes 14 are displaced in both the x- and y-directions in-plane and also in the rotation direction around the plane normal (z-direction).

First, the angle adjusting shaft 84 of the base 82 rotated to make parallel the electrode pattern 98 and the probes 14.

Figure 14B:
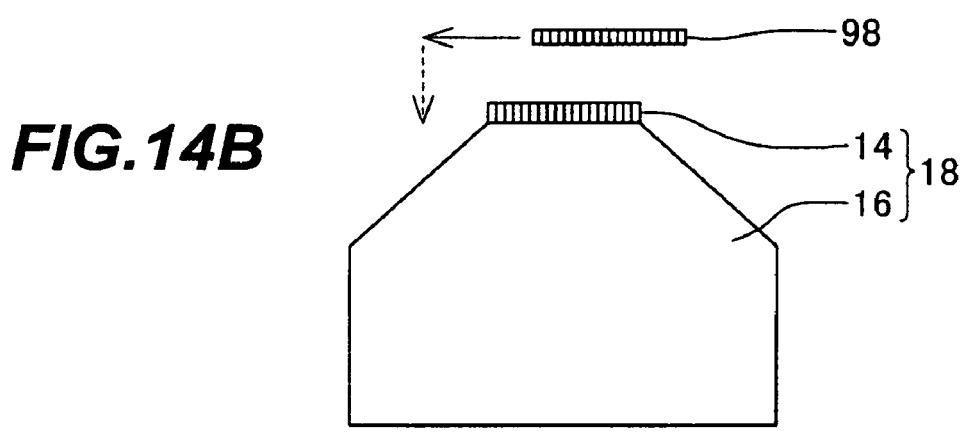

As shown in FIG. 14B, the x-direction adjusting shaft 96 is rotated to adjust the x-direction position, and the y-direction adjusting shaft 94 is rotated to adjust the y-direction position. The order of adjustment for the angle, x- and y-directions may be changed or a plurality of adjustment processes may be performed.

Figure 14C:
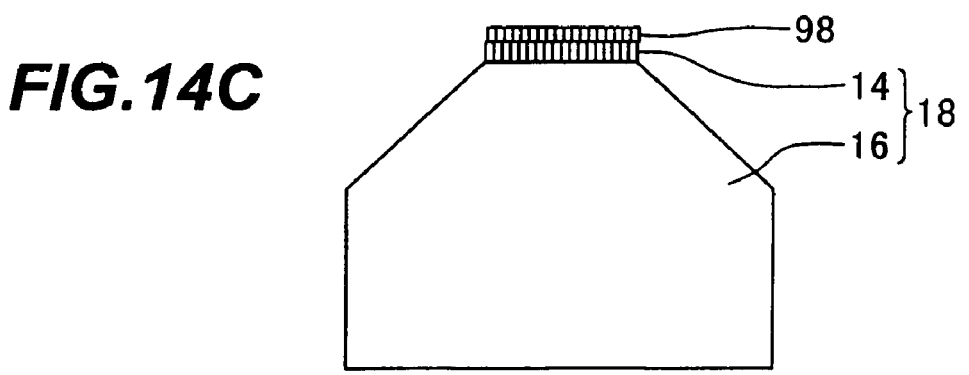

As shown in FIG. 14C, the adjustment is finished when the probes 14 take correct contact positions relative to the electrode pattern 98.

(Probe Head Assembly Method)

First, as shown in FIG. 7, the width d of the slit 22 of the probe base 20 with the probe unit 18 being coupled is adjusted to set the heights h2 of the top ends of the probes 14 of all the probe sets at the same level. More specifically, all the probe sets 10 are tentatively assembled on the table 24 by using the screws 28 or the like serving as the positioning means. In order to allow the probe sets 10 tentatively assembled to slide on the flat slide plane 25, a proper play is formed in a screw hole 26 in the table 24. Next, while the top ends of the probes 14 are visually monitored with a microscope having a focal length set to a predetermined distance, the width d of the slit 22 and the like are adjusted until the in-focus state is obtained to thereby set the heights h2 of the top ends of the probes 14 of all the probe sets.

The probe head 1 in the height adjustment completion state of the probes 14 is placed on the base 82 as shown in FIG. 13. The table 24 is correctly positioned on the flat surface of the base 82 by a positioning pin (not shown) mounted on the base 82. In this case, the probe head 1 is placed on the base 82 in the state that the base 82 has been moved to the rotation area. Next, the base 82 is moved to the position (adjustment area) near the chuck 80.

Then, the probe sets 10 are slid on the flat slide plane 25 of the table 24 to align the top ends of the probes 14 with the pattern 98 of the target, as shown in FIGS. 14A to 14C. More specifically, one of the probe bases 20 is held by the chuck 80. In this manner, the probe base 20 and probe unit 18 are positioned correctly relative to the table 24. Next, the angle adjusting shaft 84 is rotated to rotate the base 82 as well as the table 24 and target 76 around the z-axis to make the layout direction of the pattern 98 of the target parallel to the layout direction of the top ends of the probes 14. Namely, the table 24 is moved relative to the still probe unit 18 to adjust the layout direction of the top ends of the probes 14. Next, the x-direction adjusting shaft 96 and y-direction adjusting shaft 94 are rotated to move parallel the base 82 as well as the table 24 and target 76 on the x-y plane.

As the probe sets 10 are slid on the flat slide plane of the table 24, the slide surface 13 of the probe base 20 slides on the flat slide plane so that the heights h2 of the top ends of the already adjusted probes 14 will not vary. Furthermore, the position alignment of the probe set 10 and table 24 is performed independently for each of the rotation angle around the z-axis and the positions along the x- and y-directions, by using the angle adjusting shaft 84, x-axis adjusting shaft 96 and y-axis adjusting shaft 94. Accordingly, the relative position and posture of each of a plurality of probe sets 10 can be adjusted at a high precision.

Each time the position adjustment of the probe set 10 is completed, this probe set 10 is dismounted from the chuck 80, and the base 82 is moved from the adjustment area to the rotation area. Then, the base 82 is rotated by 90 degrees in the rotation area and thereafter the base 82 is moved to the adjustment area and the next probe set 10 is held by the chuck 80 so that the position alignment between the next probe set 10 and table 24 can be performed.

After the position alignment between the table 24 and all the probe sets 10 is completed, the probes 14 may be made in contact with the pattern 98 of the target 76 to perform a conduction inspection between the probes 14 and target pattern 98. This conduction inspection inspects the position misalignment between the probes 14 and target pattern 98 so that the position alignment between the probes 14 and electrodes of an inspection object electronic device can be performed reliably.

Lastly, the base 82 is moved to the rotation area to dismount the probe head 1 from the base 82, and the probe base 20 and table 24 are perfectly fixed with the screws 28 and the like as shown in FIG. 1. The assembled probe head 1 is fixed to the printed circuit board 12 with the screws 33 and the like. Since the relative position of the probes 14 is adjusted before the table 24 is fixed to the printed circuit board 12, the printed circuit board 12 can be standardized.

The present invention has been described in connection with the preferred embodiments. The invention is not limited only to the above embodiments. It will be apparent to those skilled in the art that other various modifications, improvements, combinations, and the like can be made.

What we claim are:

1. A probe head comprising:
    a table having a flat slide plane;
    a plurality of slide units each having a slide surface for sliding on said flat slide plane;
    a lift unit provided for each of said slide units, said lift unit being capable of moving along a vertical direction;
    probes provided for each of said lift units, a top end of each of said probes protruding from said lift unit; and
    positioning means for positioning said lift unit relative to said slide unit and said slide unit relative to said table.
2. The probe head according to claim 1, wherein said lift unit comprises a movable unit movable along the vertical direction relative to said slide surface and a support unit fixed to said movable unit and disposed with said probes.
3. The probe head according to claim 1, wherein:
    said lift unit comprises a movable unit integrally formed with said slide unit and having one end connected to said slide unit and another end made as a free end, and a support unit fixed to said movable unit and disposed with said probes; and
    said positioning means includes a screw threaded into said slide unit for moving said movable unit along a direction extending remote from said slide surface and along a direction extending near to said slide surface.
4. The probe head according to claim 1, wherein:
    said lift unit comprises a movable unit supported pivotally by said slide unit and a support unit fixed to said movable unit and disposed with said probes; and
    said positioning means includes a screw threaded into said slide unit for moving said movable unit along a direction extending remote from said slide surface and along a direction extending near to said slide surface.
5. The probe head according to claim 1, wherein said slide unit includes guide means for guiding said lift unit slidably along a direction inclined relative to said slide surface.
6. The probe head according to claim 5, wherein said lift unit comprises a movable unit for sliding along the direction inclined relative to said slide surface by being guided by said guiding means, a support unit disposed with said probes and an engagement unit for detachably engaging said support unit with said movable unit.
7. The probe head according to claim 1, further comprising an elastic member interposed between said lift unit and said slide unit, wherein said positioning means includes a screw threaded into said lift unit and said slide unit.
8. The probe head according to claim 1, wherein said table is fixed to a printed circuit board to be electrically connected to said probes.
9. An assembly method for the probe head recited in claim 1, comprising the steps of:
    moving said lift unit along the vertical direction relative to said slide surface to determine a position of said lift unit relative to said slide unit; and
    sliding said slide unit on said flat slide plane to determine a position of said slide unit relative to said table.
10. A probe card comprising:
    a printed circuit board;
    a support unit whose position is determined relative to said printed circuit board;
    probes held by said support unit;
    adjusting means for adjusting a position or posture of said support unit relative to said printed circuit board; and
    a flexible printed circuit board having flying leads whose top ends are connected to said probes or electrodes of said printed circuit board, said flexible printed circuit board electrically connecting said probes and the electrodes of said printed circuit board.

* * * * *